United States Patent
Horak et al.

(10) Patent No.: US 11,978,820 B2
(45) Date of Patent: May 7, 2024

(54) THIN SINGLE-CRYSTAL SILICON SOLAR CELLS MOUNTED TO A STRUCTURAL SUPPORT MEMBER AND METHOD OF FABRICATING

(71) Applicant: Semivation, LLC, Fairfax, VT (US)

(72) Inventors: David Vaclav Horak, Essex Junction, VT (US); Peter H Mitchell, Jericho, VT (US); Mark Charles Hakey, Milton, VT (US); William R. Tonti, Greenland, NH (US); James Marc Leas, South Burlington, VT (US)

(73) Assignee: Semivation, LLC, Fairfax, VT (US)

( * ) Notice: Subject to any disclaimer, the term of this patent is extended or adjusted under 35 U.S.C. 154(b) by 0 days.

(21) Appl. No.: 17/949,202

(22) Filed: Sep. 20, 2022

(65) Prior Publication Data

US 2024/0097065 A1 Mar. 21, 2024

(51) Int. Cl.

| | |
|---|---|
| *H01L 31/18* | (2006.01) |
| *H01L 31/0224* | (2006.01) |
| *H01L 31/054* | (2014.01) |
| *H01L 31/068* | (2012.01) |

(52) U.S. Cl.
CPC ...... *H01L 31/1804* (2013.01); *H01L 31/0547* (2014.12); *H01L 31/068* (2013.01); *H01L 31/022425* (2013.01)

(58) Field of Classification Search
CPC ......... H01L 31/022425; H01L 31/0547; H01L 31/068; H01L 31/1804
See application file for complete search history.

(56) References Cited

U.S. PATENT DOCUMENTS

| | | | |
|---|---|---|---|
| 5,554,229 A * | 9/1996 | Vogeli | H01L 31/0547 257/459 |
| 10,589,445 B1 * | 3/2020 | Furukawa | B28D 5/0011 |
| 2010/0037939 A1 * | 2/2010 | Eickelmann | H01L 31/1868 136/255 |
| 2012/0024928 A1 * | 2/2012 | Matsumoto | C03B 35/189 225/2 |
| 2012/0229911 A1 * | 9/2012 | Rodriguez-Parada | H01L 31/0547 359/642 |
| 2012/0234887 A1 * | 9/2012 | Henley | H01L 31/068 225/93 |

(Continued)

*Primary Examiner* — Mayla Gonzalez Ramos
(74) *Attorney, Agent, or Firm* — James Marc Leas

(57) ABSTRACT

A method of fabricating a single-crystal silicon photovoltaic cell includes providing a single-crystal silicon wafer and a structural support member. The single-crystal silicon wafer has a first major surface and a second major surface. Each major surface extends along a major surface plane. The single-crystal silicon wafer has a thickness greater than 100 micrometers and a dimension greater than 50 mm. The method further includes mounting the structural support member to the first major surface or to the second major surface. The method further includes reducing thickness of the single-crystal silicon wafer to a thickness less than or equal to 100 micrometers while the single-crystal silicon wafer is mounted to the structural support member. The method further includes providing the first major surface with a diffusion and a metalization grid and providing the second major surface with a back surface contact.

21 Claims, 26 Drawing Sheets
(18 of 26 Drawing Sheet(s) Filed in Color)

(56) References Cited

U.S. PATENT DOCUMENTS

2012/0273043 A1* 11/2012 Lochtefeld .......... H01L 31/1896
438/57

* cited by examiner

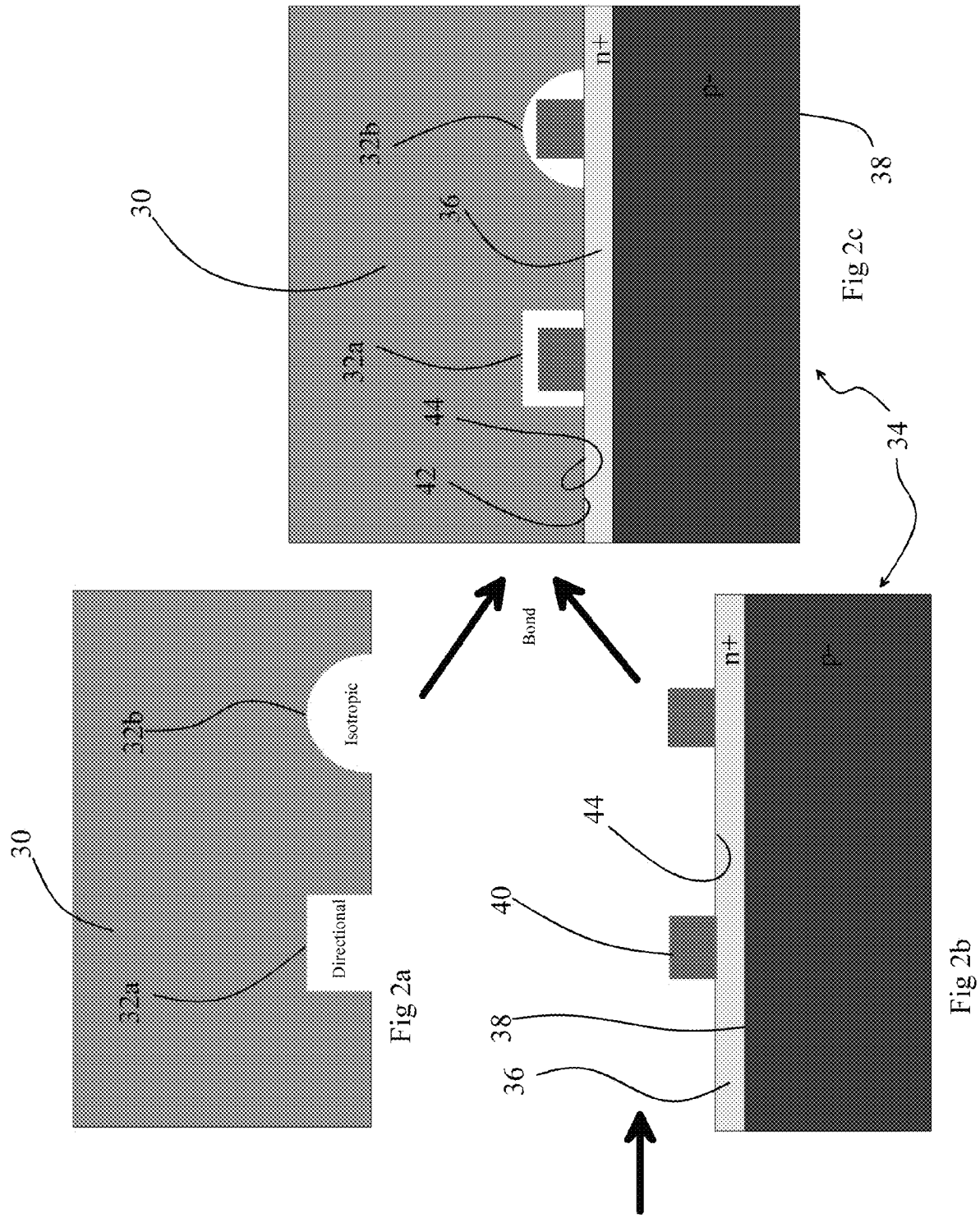

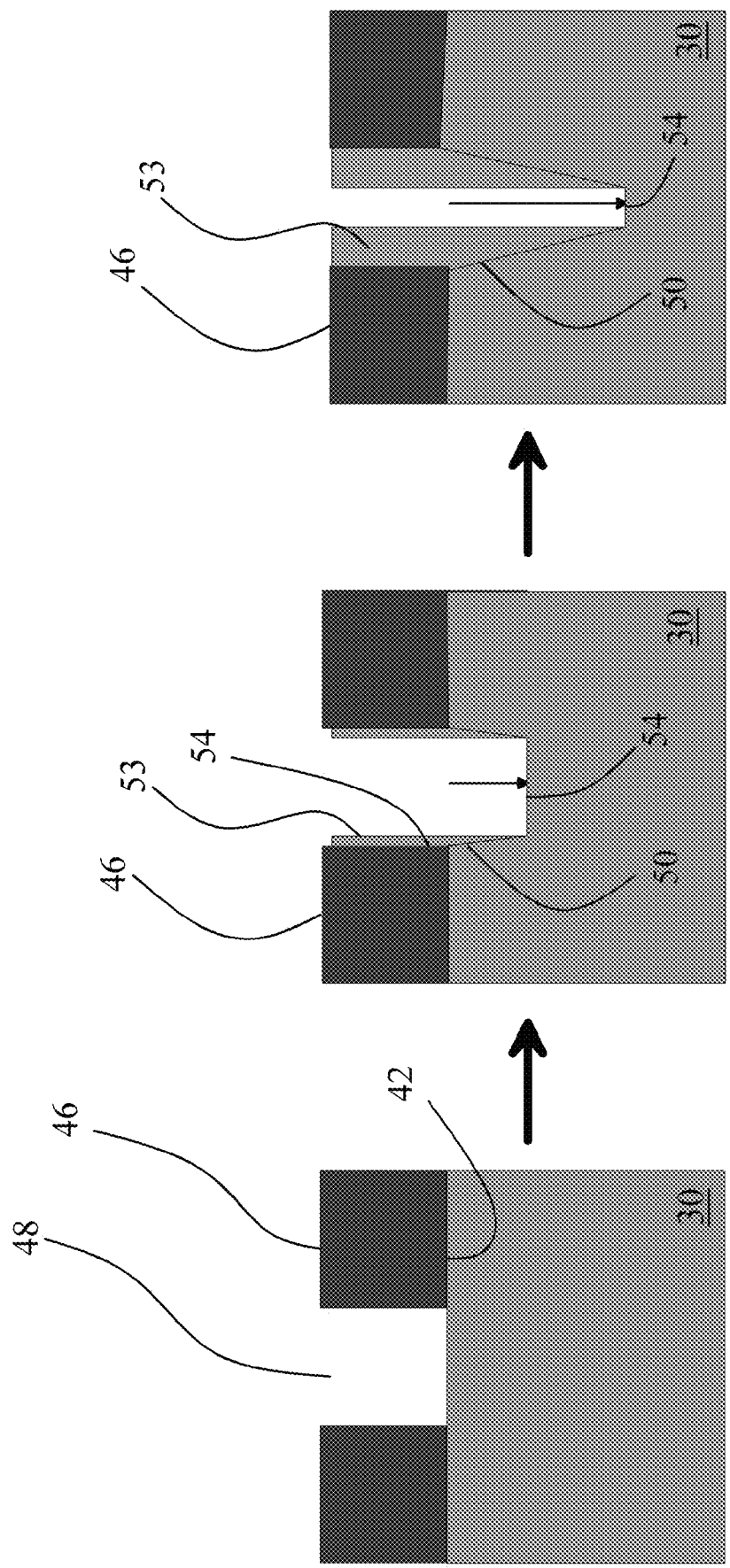

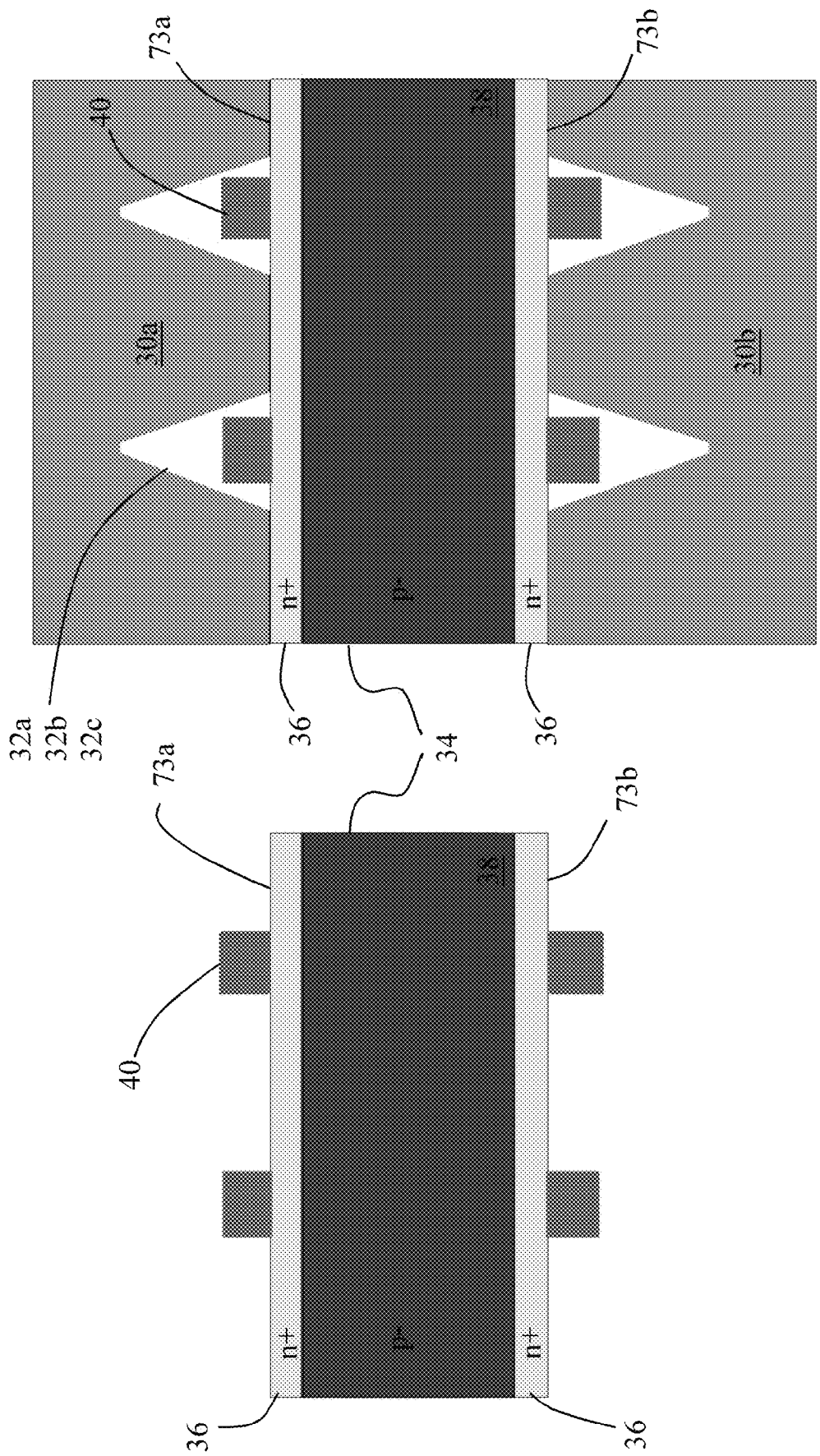

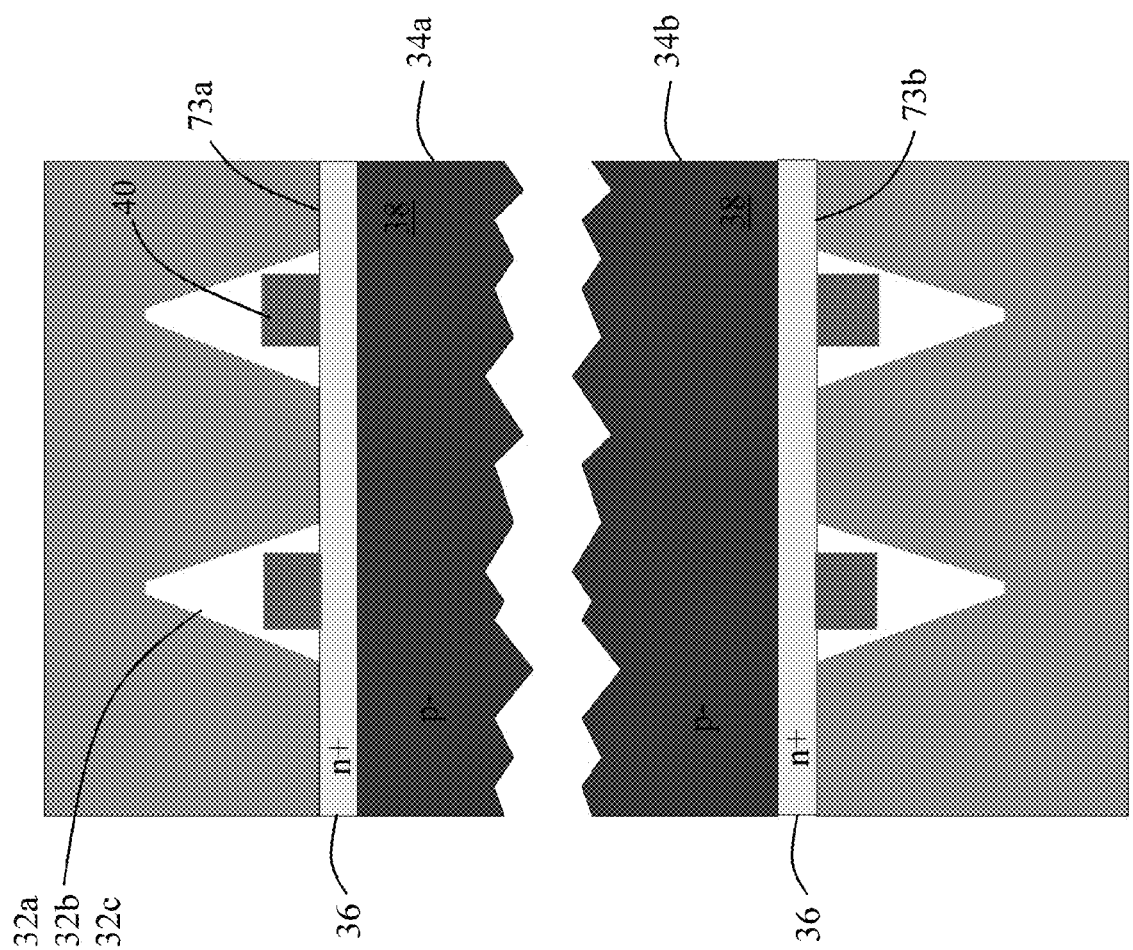

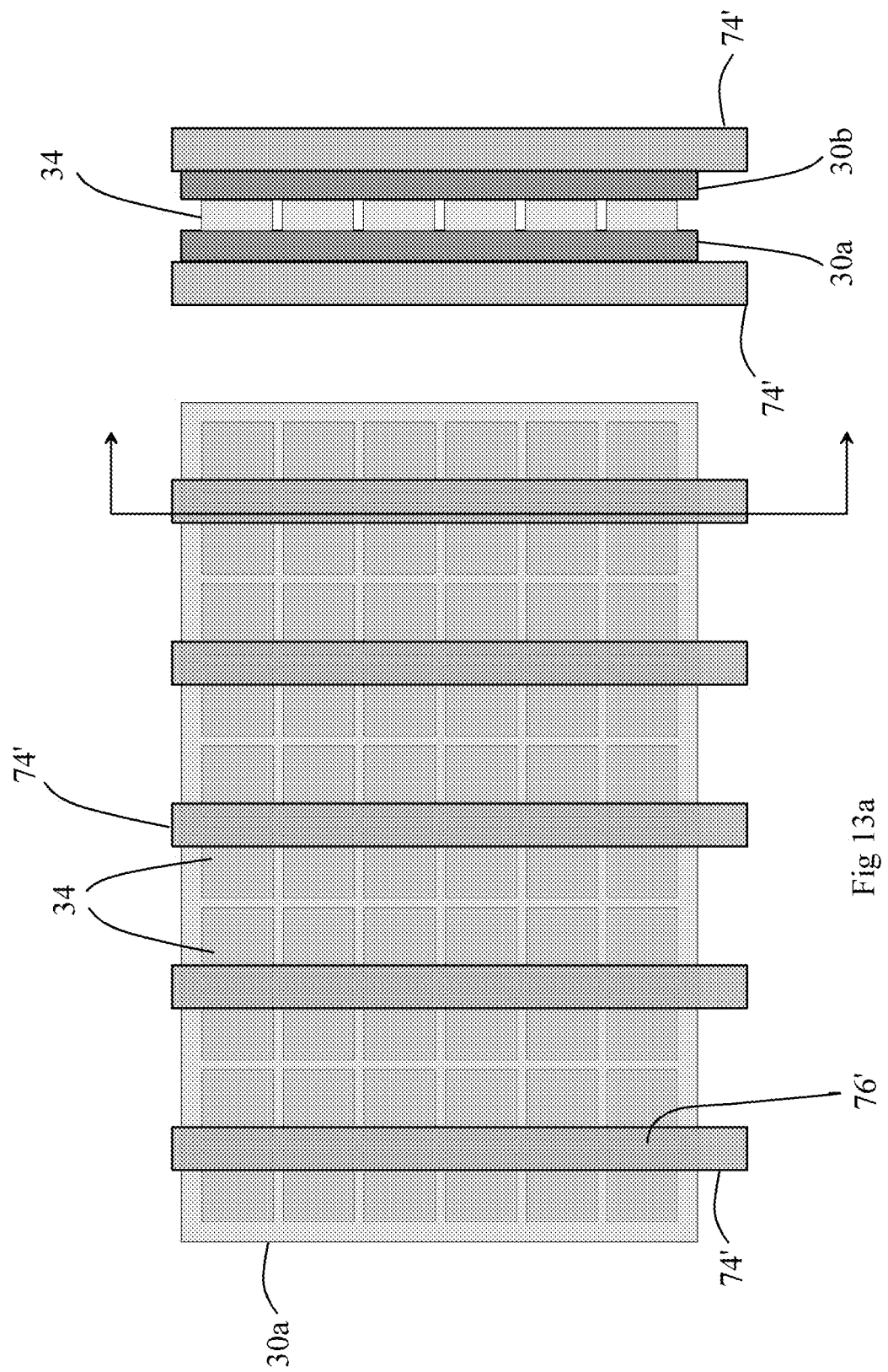

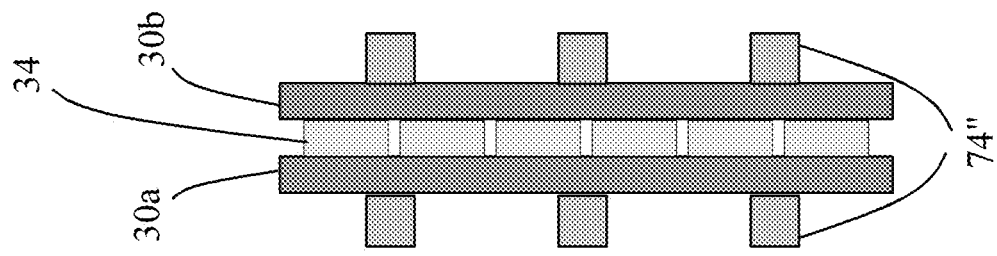
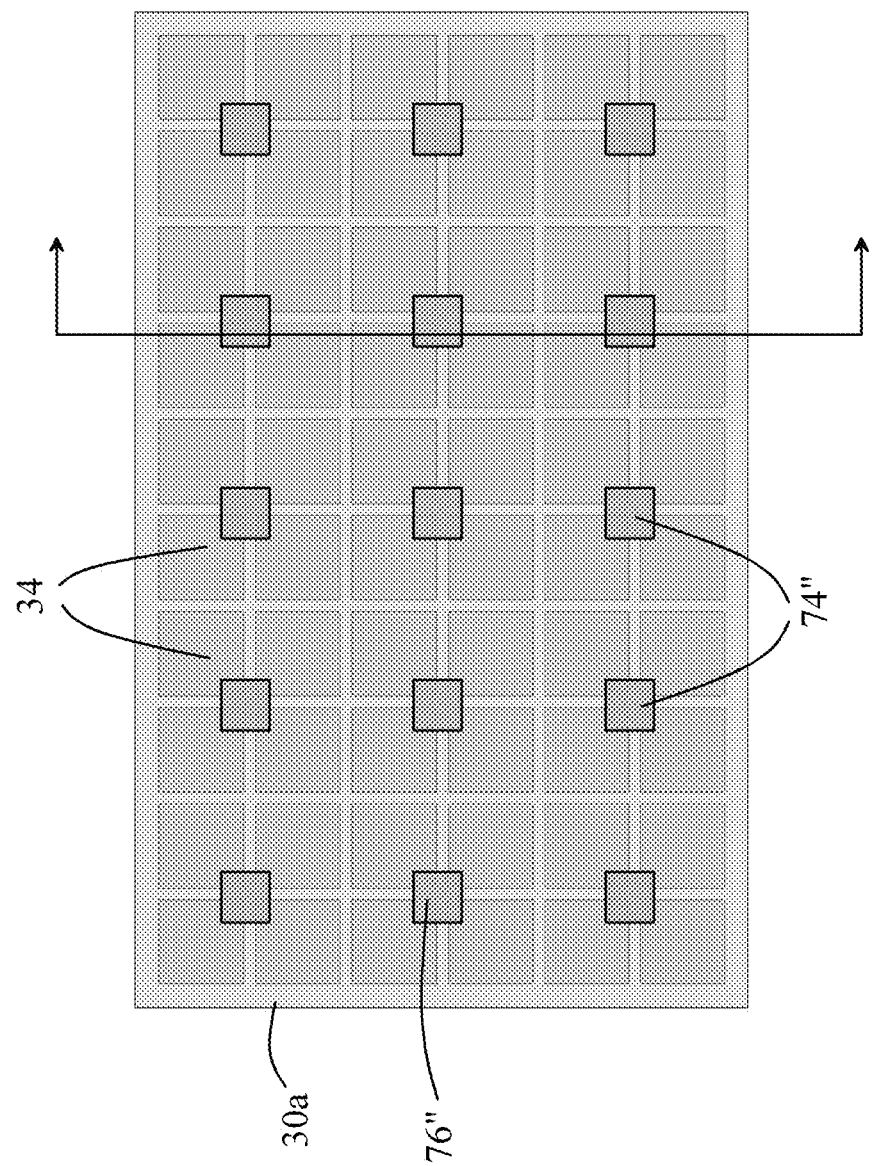

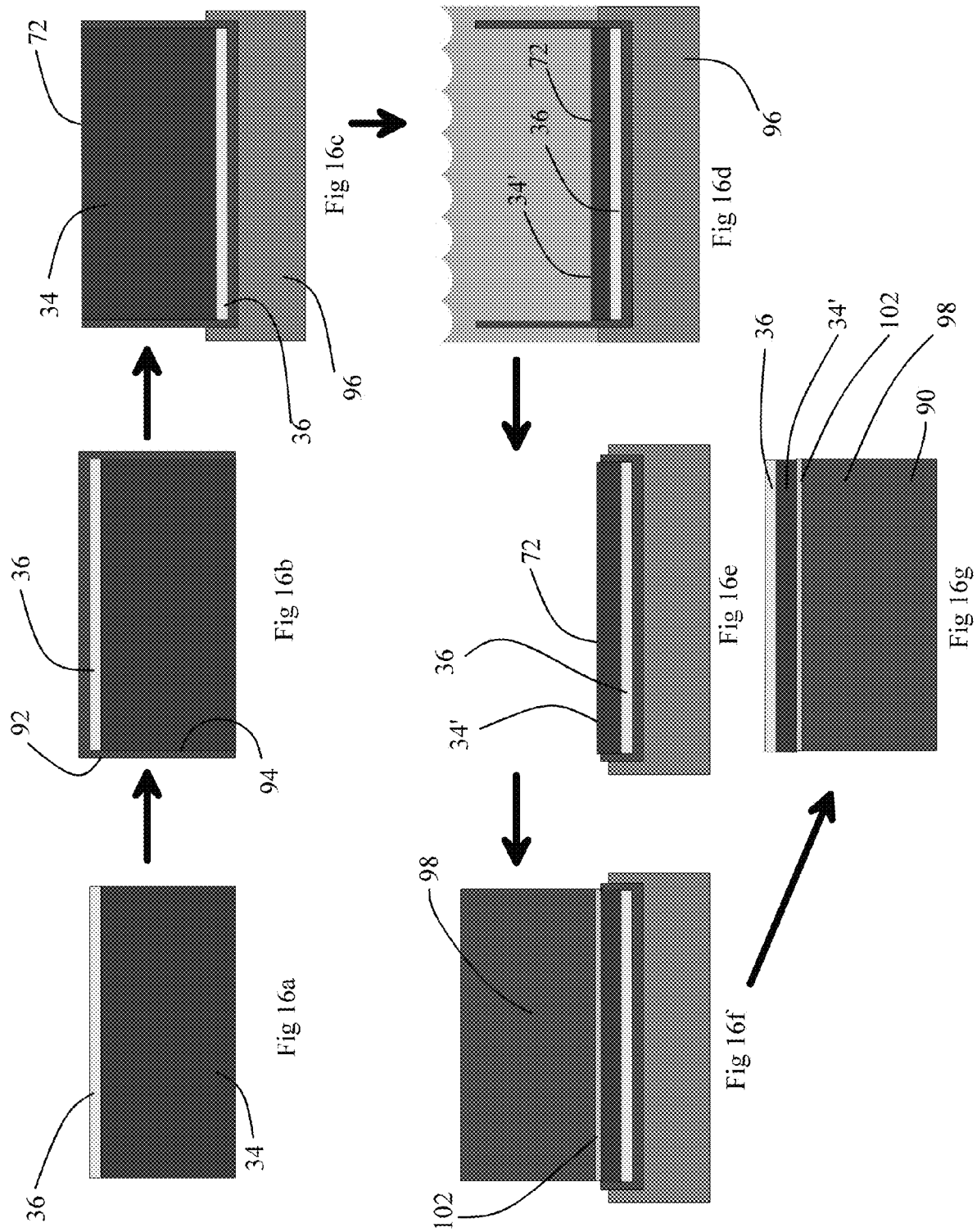

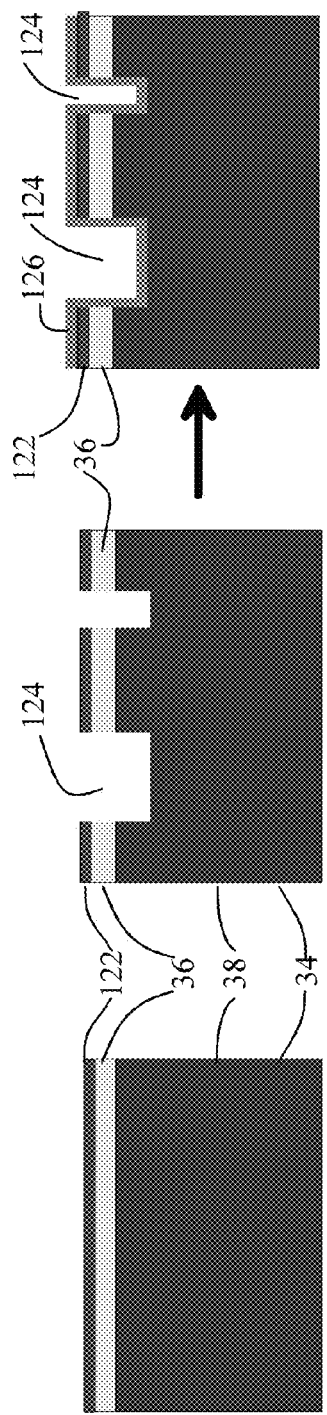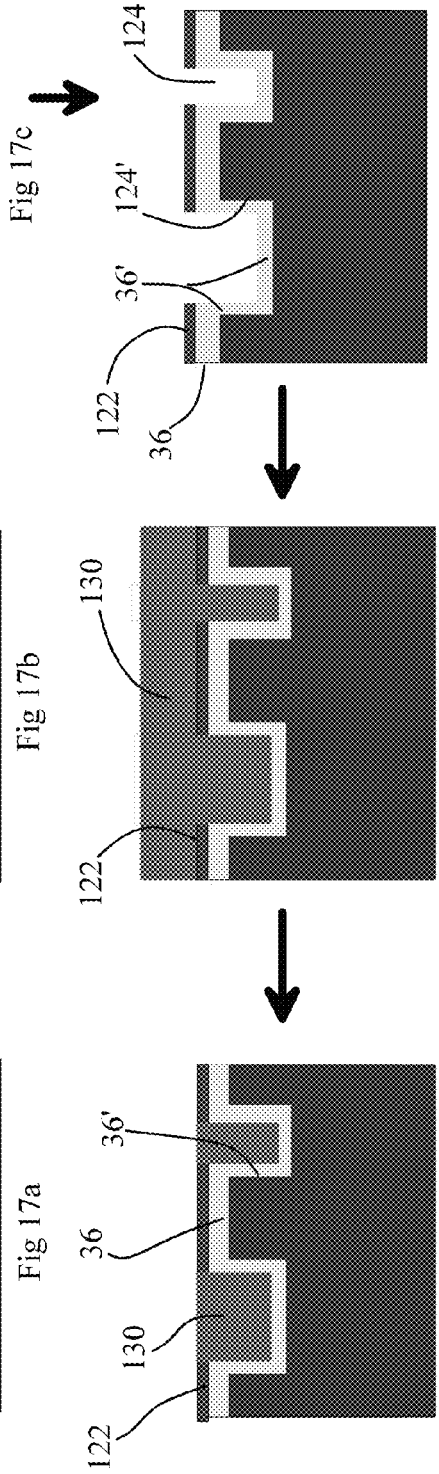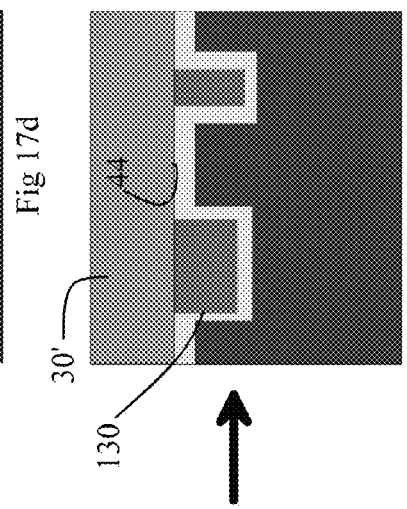

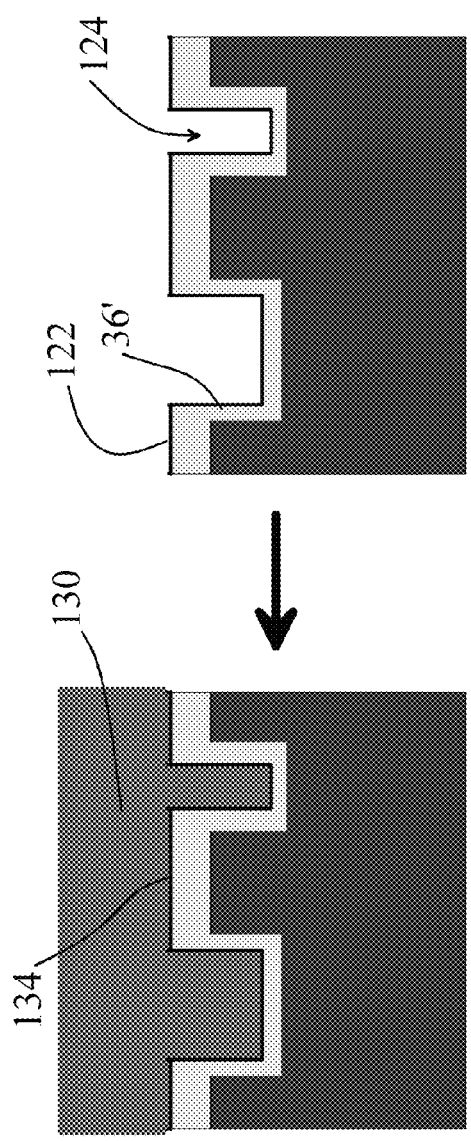
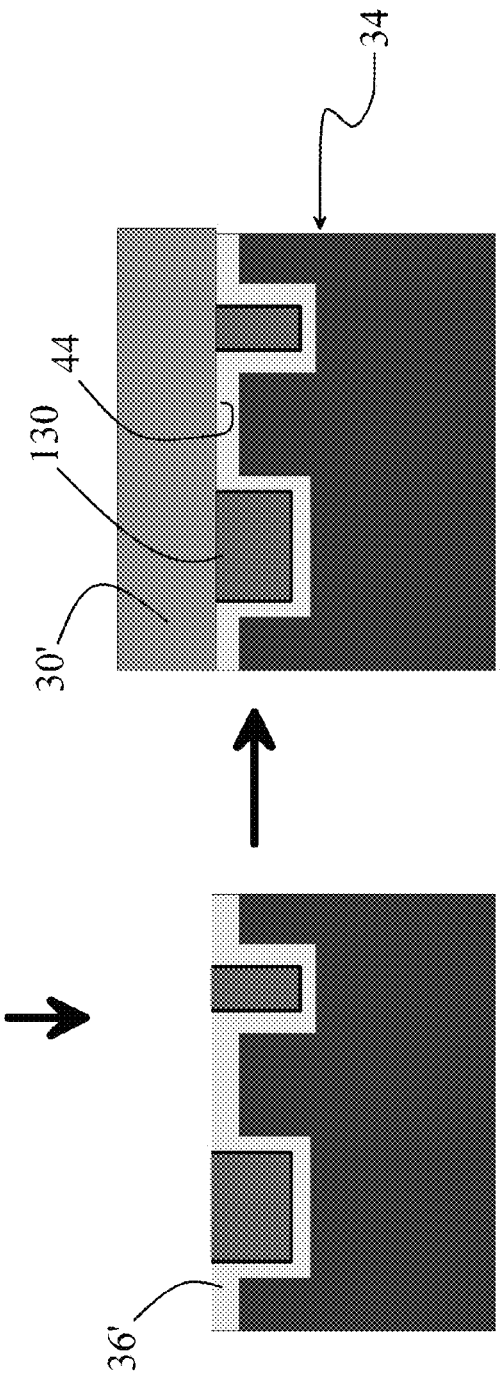

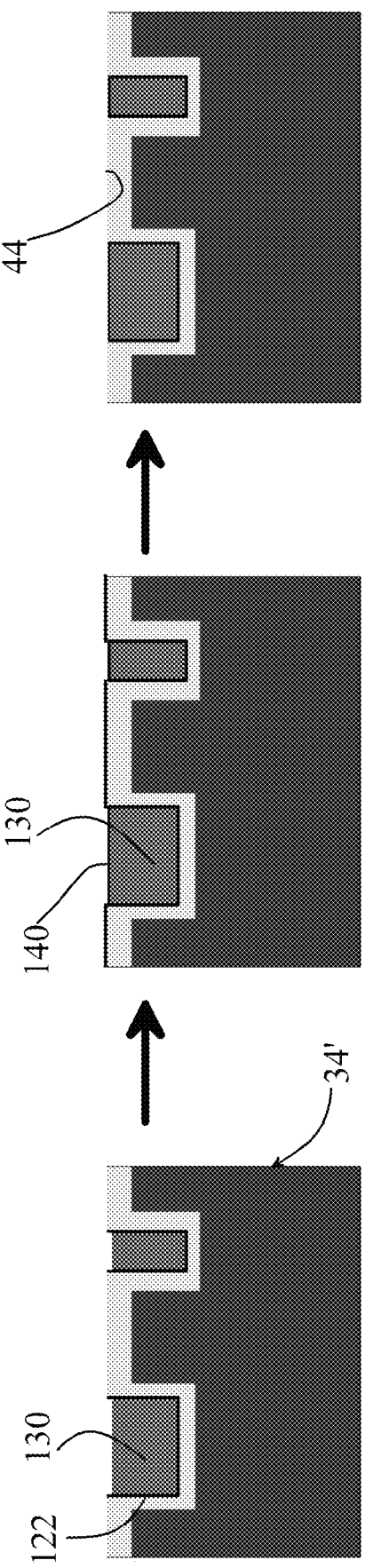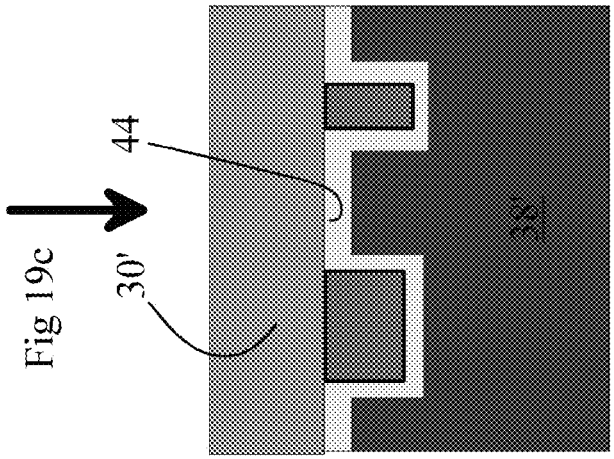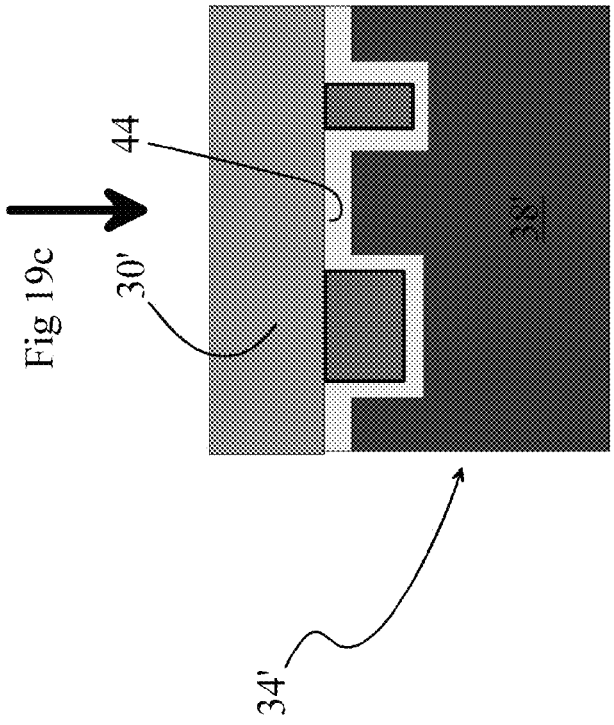

THIN SINGLE-CRYSTAL SILICON SOLAR CELLS MOUNTED TO A STRUCTURAL SUPPORT MEMBER AND METHOD OF FABRICATING

FIELD

This patent application generally relates to techniques for forming solar cells. More particularly, it is related to techniques for forming thin solar cells. Even more particularly, it is related to techniques for forming large durable thin solar cells. Even more particularly, it is related to techniques for forming solar cells with reduced grid-metalization shadowing.

BACKGROUND

Improvements to solar cell efficiency are key to lowering cost of solar cells and solar panels and furthering widespread use. Among the techniques available for increasing efficiency but not yet widely implemented is ultra-thin single-crystal silicon. A problem has been durability of such thin single-crystal silicon, and improvement is provided in the current patent application.

SUMMARY

One aspect of the present patent application is a method of fabricating a single-crystal silicon photovoltaic cell. The method includes providing a single-crystal silicon wafer and a structural support member. The single-crystal silicon wafer has a first major surface and a second major surface. Each major surface extends along a major surface plane. The single-crystal silicon wafer has a thickness greater than 100 micrometers and a dimension greater than 50 mm. The method further includes mounting the structural support member to the first major surface or to the second major surface. The method further includes reducing thickness of the single-crystal silicon wafer to a thickness less than or equal to 100 micrometers while the single-crystal silicon wafer is mounted to the structural support member. The method further includes providing the first major surface with a diffusion and a metalization grid and providing the second major surface with a back surface contact.

Another aspect of the present patent application is a device comprising, a single-crystal silicon photovoltaic cell and a structural support member. The single-crystal silicon photovoltaic cell has a first major surface and a second major surface. The first major surface has a metalization grid which includes a plurality of grid metalization lines. At least one from the group consisting of the first surface and the second surface is bonded to the structural support member. The single-crystal silicon photovoltaic cell has a dimension of at least 50 mm and a single-crystal silicon thickness of less than or equal to 100 micrometers.

In one embodiment the single-crystal silicon thickness is less than or equal to 50 micrometers. In another, the single-crystal silicon thickness is less than or equal to 25 micrometers.

In one embodiment, the silicon photovoltaic cell is anodically bonded to the structural support member. In another embodiment it is epoxy bonded.

In one embodiment, the first major surface includes inverted pyramids and the second major surface includes a reflector. In one version of this embodiment, the second surface includes at least one from the group consisting of a minority carrier reflector, a light reflector, and a passivation layer.

In one embodiment the structural support member is a metal and is mounted to the second major surface.

In another embodiment the structural support member is glass and is mounted to the first major surface, which includes the grid metalization lines. In one embodiment the structural support member includes grooves extending over the grid metalization lines. In one aspect the grooves in the structural support member have an inverted V-angled cross section configured so sunlight incident on the grooves is reflected between the metalization lines. In this embodiment a vacuum or a material within the grooves is provided that allows total internal reflection of sunlight incident on the inverted V-angled grooves. In another aspect a reflective material is provided on the groove surface. In this embodiment, the first major surface is provided with a diffusion and a metalization grid in advance of the mounting step (b). Because the metalization is within the grooves, the bonding is between the first major surface and the structural support member. In this embodiment, the reducing the thickness and providing the back surface contact is performed after the mounting step (b).

In one embodiment, the first major surface includes inverted pyramids.

In one embodiment the grid metalization includes a plurality of fingers, a bus bar and an overtab conductor, in which the fingers connect to the bus bar, the overtab conductor electrically contacts the busbar in a plurality of locations, and in which the groove extends over the grid metalization. In one embodiment, the overtab conductor extends to provide a connecting conductor for connection to an adjacent cell in a panel. In another embodiment, a connecting conductor contacts the overtab conductor. In one embodiment the bus bar is omitted and the overtab conductor electrically contacts each grid metalization finger.

In one embodiment, the reducing thickness method includes stressing to cleave the single-crystal silicon wafer parallel to the first major surface, such as by applying a thermal and/or a mechanical stress. In one aspect, mechanical stressing is provided by a pushing-apart device, such as a ball, a roller, or a wedge. In another embodiment, structural support member is of a material with a Young's Modulus different from that of the single-crystal silicon wafer so mechanical strain provides differential stress.

In one embodiment, stressing includes providing the structural support member that has a thermal expansion coefficient different from that of the single-crystal silicon wafer. In one aspect, a thermal gradient is provided while cooling.

In one embodiment, reducing thickness includes at least one from the group consisting of etching, grinding, and polishing the single-crystal silicon wafer.

In one embodiment, the structural support member is sized to support a plurality of the single-crystal silicon wafers, in which the reducing thickness step is performed on a plurality of single-crystal silicon wafers after mounting the plurality of single-crystal silicon wafers on the structural support member.

In one embodiment, reducing thickness includes at least one from the group consisting of etching, grinding, polishing, and stressing the plurality of single-crystal silicon wafers mounted on the structural support member.

In one embodiment, the grid metalization is Damascene-recessed in the single-crystal silicon wafer.

In one embodiment, inverted pyramids are formed on the first major surface and a reflector is formed on the second major surface, wherein the forming a reflector includes forming back surface texturing or forming a back surface grating.

In one embodiment, a back surface passivation is formed.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing and other aspects and advantages of the invention will be apparent from the following detailed description, as illustrated in the accompanying drawings, in which:

FIG. 2a shows a cross sectional view of a structural support member with grooves;

FIG. 2b shows a cross sectional view of a single-crystal silicon wafer with a diffused region and a front surface metallization grid;

FIG. 2c' is a cross sectional view of the structural support member mounted on the a single-crystal silicon wafer of FIG. 2c in which the structural support member has V-shaped grooves;

FIG. 2c" is a cross sectional view of the structural support member mounted on the a single-crystal silicon wafer of FIG. 2c' in which the V-shaped grooves have a reflective coating;

FIGS. 3a-3c are cross sectional views of one embodiment of a process to form the V-shaped grooves in the glass structural support member of FIG. 2c' in which a masking layer with openings is deposited using a reactive ion etch recipe that gradually deposits an organic layer along groove sidewalls as silicon is etched;

FIG. 5d' is a detail view of FIG. 5d showing how the reactive ion etch sputters away sharp corners;

FIGS. 11a to 11b are cross sectional views showing a single-crystal silicon wafer with front surface diffusions and metallization grids on both sides, and a structural support member of FIG. 2c' mounted on both sides of the single-crystal silicon wafer;

FIGS. 11c is a cross sectional view of the wafer of FIG. 11b which the wafer was then cleaved to form two thinner single-crystal silicon wafers each with a front surface diffusion, a metallization grid and a structural support member;

FIGS. 13a and 13b are top views of panel-sized glass structural support members supporting a plurality of wafers, all of which are to be cleaved with asymmetric force provided by cooling elements;

FIGS. 13a' and 13b' are cross sectional views of the panel-sized glass structural support members supporting the plurality of wafers of FIGS. 13a and 13b;

FIGS. 16a-16g are cross sectional views showing steps for thinning the wafer and performing back side processing to provide a back surface field, passivation, a back surface light reflector, and a back surface structural support member;

FIGS. 17a-17i are cross sectional views showing steps of an embodiment in which the metallization grid is formed by a Damascene process to provide a planar front surface before the structural support member is bonded;

FIGS. 18a-18d are cross sectional views showing alternative steps of an embodiment in which the metallization grid is formed by the Damascene process to provide a planar front surface before the structural support member is bonded; and FIGS. 19a-19d are cross sectional views showing alternative steps of another embodiment in which the metallization grid is formed by the Damascene process to provide a planar front surface before the structural support member is bonded.

DETAILED DESCRIPTION

The present patent application provides methods of forming thin and ultra-thin photovoltaic cells. The application includes embodiments of wafer-sized cells with thin and ultra-thin single-crystal silicon supported by a structural support member, surface texturization, surface photovoltaic cell grid metalization, light trapping, back surface field, and back surface reflector. It also includes embodiments with Damascene-recessed grid metalization. It also includes embodiments with metalization grid shadowing avoidance.

In one embodiment, single-crystal silicon surface is textured, such as with random inverted pyramids, as shown in FIGS. 1a to 1d and described in the article "Maskless inverted pyramid texturization of single-crystal silicon," Wang, Y., Yang, L., Liu, Y. et al., Sci Rep 5, 10843 (2015). https://doi.org/10.1038/srep10843. A $Cu(NO_3)_2/HF/H_2O_2/H_2O$ mixture at 50° C. was used. In the process the wafer was etched for 15 min at 50° C. in a polytetrafluoroethylene container filled with 5 mM $Cu(NO_3)_2$, 4.6 M HF and 0.55 M $H_2O_2$ to provide the inverted pyramids. An antireflective coating, such as titanium oxide, can be applied to the textured single-crystal silicon.

Figure 1A:
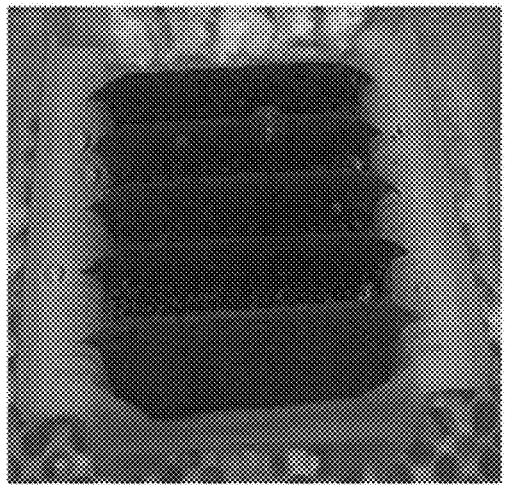
FIG. 1a shows a prior art boatload of wafers during etching to provide the inverted pyramids etched in the silicon surface shown in the prior art electron micrographs of FIGS. 1b-1d.
Figure 1B:
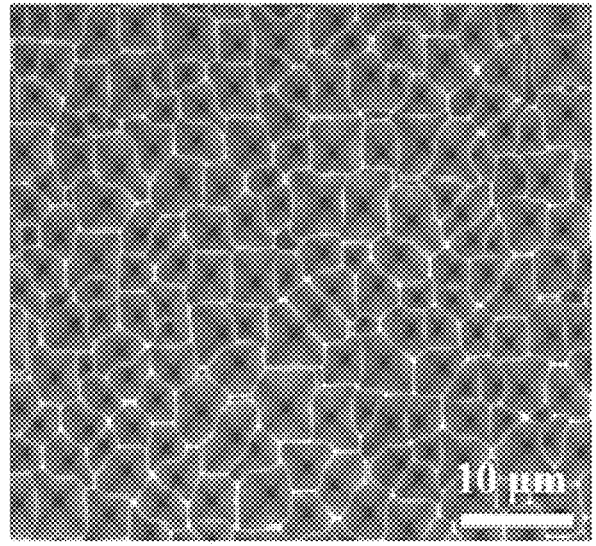
Figure 1C:
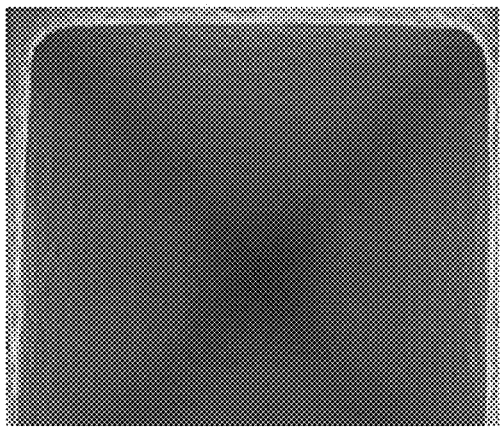
Figure 1D:
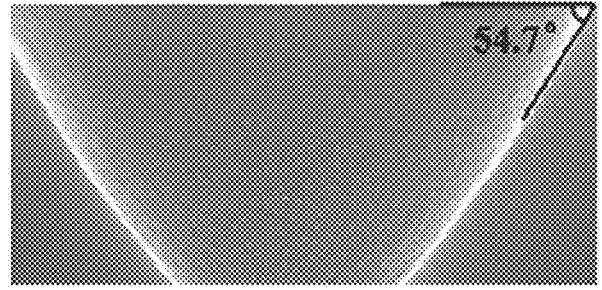
Figure 2C:
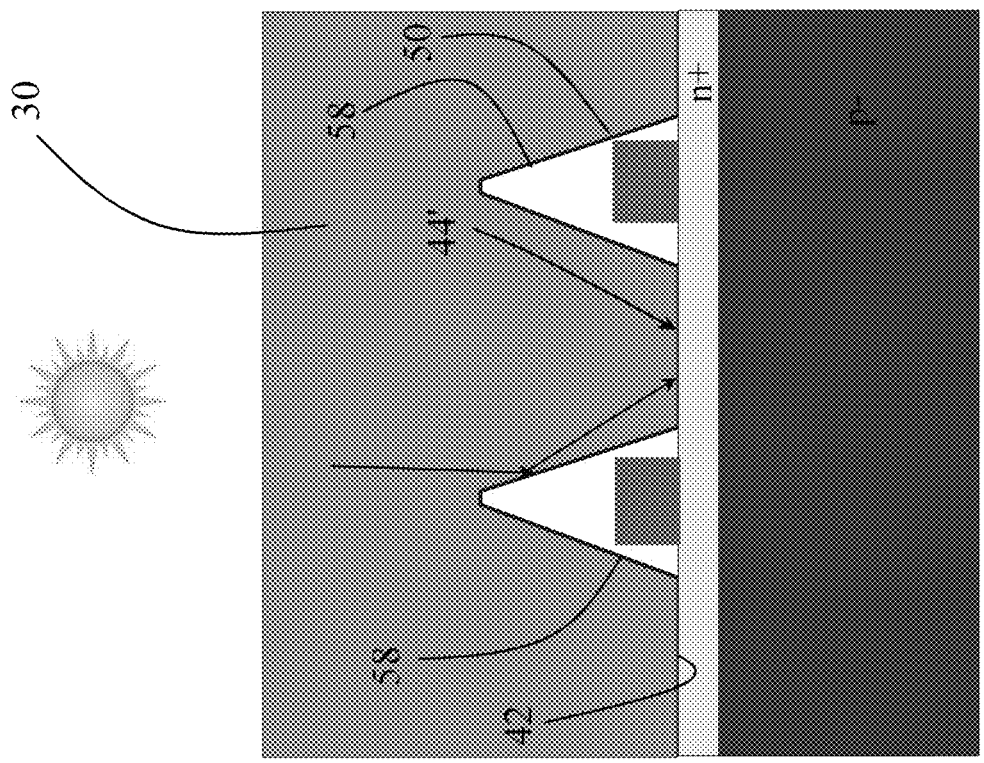
FIG. 2c is a cross sectional view of the structural support member of FIG. 2a mounted on the single-crystal silicon wafer with its metalization grid fitting into the grooves.
Figure 2C:
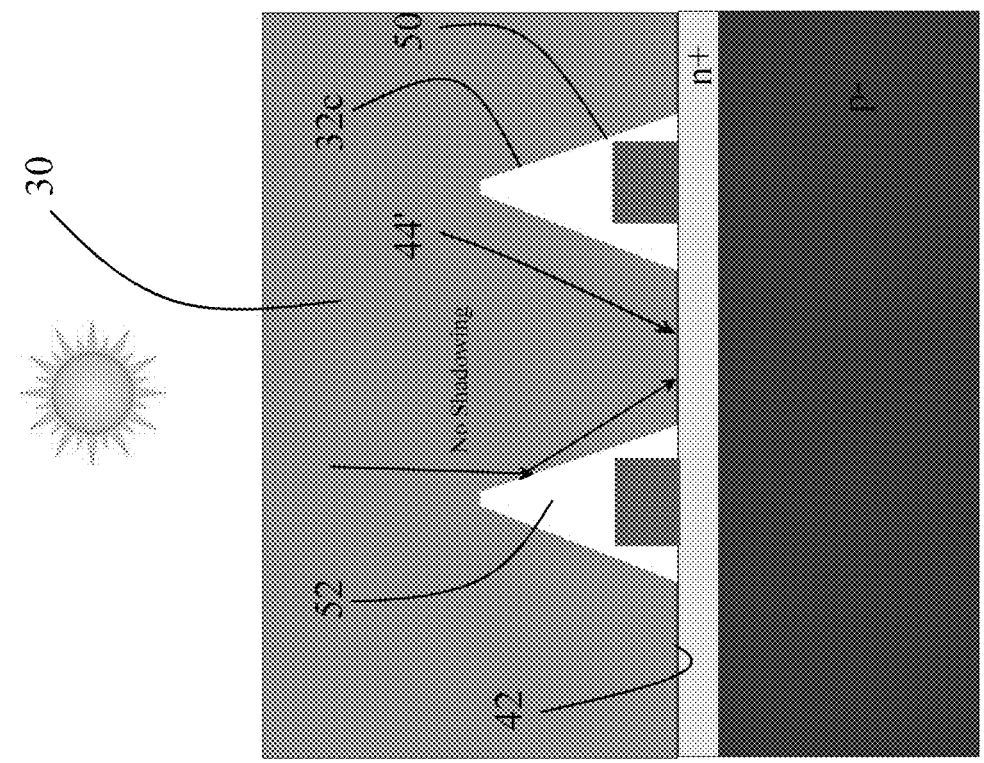

In one embodiment glass structural support member 30 with directional etched grooves 32a or isotropic etched grooves 32b is bonded to single-crystal silicon wafer 34 having the inverted pyramids of FIG. 1a to 1d, n+ diffusion 36 in single-crystal silicon p-substrate 38, and front surface metalization grid 40, as shown in FIGS. 2a-2c. Glass structural support member 30 may be fabricated of a material, such as borosilicate glass (BSG) or B270 soda lime glass.

Directional grooves 32a or isotropic grooves 32b are etched in glass structural support member 30 mirroring the pattern of front surface metalization grid 40, including both its fingers and its busbars, allowing glass surface 42 to mate with single-crystal silicon front major surface 44 with grooves 32a, 32b extending over front surface metalization grid 40.

In one embodiment, grooves 32a, 32b are formed by depositing etch masking layer 46 with openings 48 on glass surface 42, as shown in FIG. 3a. A process, such as screen printing can be used. Isotropic grooves 32b are formed by etching in a hydrofluoric acid bath. Alternatively, plasma etching system using CF4 and O2, 200 mTorr, with a measured DC bias of −150 volts can be used.

In another embodiment, directional etch grooves 32a are formed in a reactive ion etch reactor with a fluorine and carbon containing molecules, such as CHF3 or CF4, and oxygen. The power conditions and the amount of oxygen are tuned to provide sufficient sidewall polymer deposition to protect the lateral edges of masking layer 46 without such an amount of sidewall polymer deposition as to produce sidewall taper.

In another embodiment, sidewalls 50 of grooves 32c of glass structural support member 30 have an inverted V-angled cross section, as shown in FIG. 2c', reflecting incident sunlight that would otherwise be incident on metalization grid 40 toward adjacent single-crystal silicon surface 44'. If a low index material is in cavity 52, such as air, total internal reflection can be relied upon to direct sunlight incident on groove 32c from within a range of angles centered on the perpendicular toward adjacent single-crystal silicon surface 44'. Thus, the effect of shadowing by metalization grid 40 is substantially reduced.

To form V-grooves 32c, etch chemistry, such as CHF3/CF4/Ar/O2 is tuned to deposit fluorine and carbon containing polymers 53 on etch mask sidewalls 54 and on glass groove sidewalls 50, protecting these sidewalls 50, 54 from further etch while the fluorine and argon continue to directionally etch bottom glass surface 54 down into the glass, as shown in FIGS. 3b and 3c. The less oxygen flow the more sidewall deposition of carbon-fluorine containing polymer and the greater the taper, while ions have enough energy and the oxygen released during the SiO2 etch prevents the bottom of the glass from being coated with carbon-fluorine polymer.

Figure 4C:
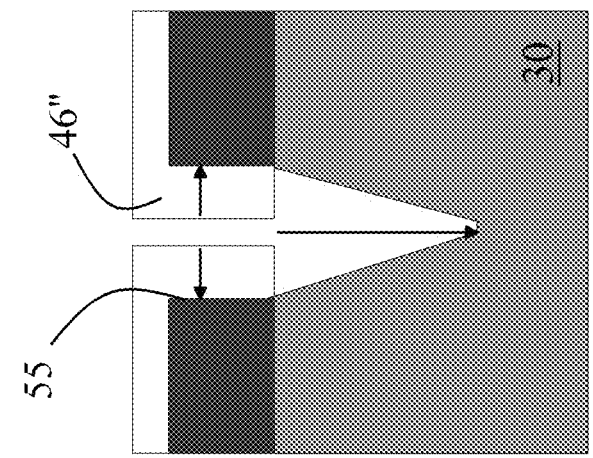
FIGS. 4a-4c are cross sectional views of another embodiment of a process to form the V-shaped grooves in the glass structural support member of FIG. 2c' using a reactive ion etch recipe that gradually etches the masking layer, increasing the width of the opening in the masking layer as silicon is etched.
Figure 4B:
Figure 4A:
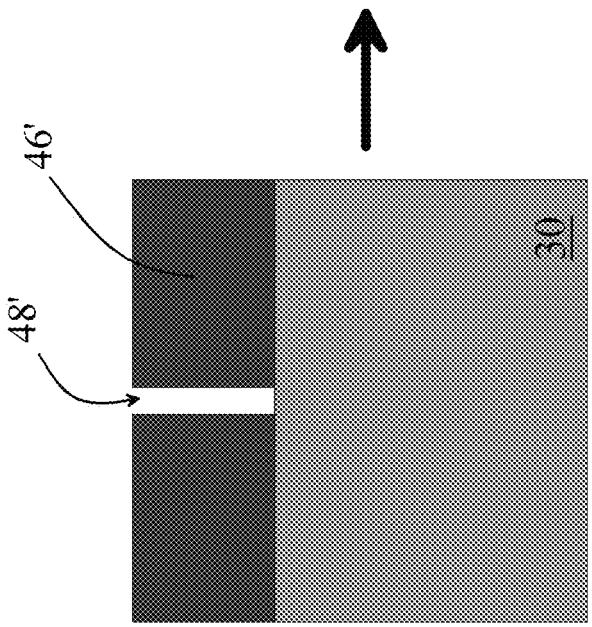

In another variation of this V-shaped groove embodiment, etch masking layer 46' is deposited with small openings 48', as shown in FIG. 4a. $CHF_3/CF_4/Ar/O_2$ flows are tuned so sidewalls 55 of etch masking layer 46' are also attacked, increasing the size of the openings 48', as shown in FIGS. 4b and 4c, thus providing V-groove tapered sidewalls in glass substrate 30. For example, increasing the flow of oxygen and increasing the pressure laterally etches mask layer 46' while also mostly eliminating any organic sidewall deposition on sidewalls of glass substrate 30. The most time for sideways etching is, therefore, at the top of the trench with gradually less time for sideways etching descending into the trench, thus, providing the sloping shape to V-groove 32c. Masking layer 46' is made thick enough to continue providing surface protection while it is etched back from the edge.

Because of huge variability in reactor designs, one methodology to tune is to take the standard vertical oxide etch and increase the amount of oxygen until the reaction is moved past the polymer point on glass sidewalls. At this point the oxygen will laterally etch the etch mask, and the more the oxygen flow, the faster the lateral subtractive etch of the etch mask, which results in a shallower taper of the V-shaped groove. A starting process would be 100 standard cubic centimeters per minute (SCCM) Ar, 50 SCCM $CHF_3$, 20 SCCM $CF_4$ and 10 SCCM of $O_2$, at 20 um pressure, and with power set to provide a DC voltage of −400V across the electrodes. Tuning according to the particular reactive ion etch equipment used would refine the process.

Figure 5C:
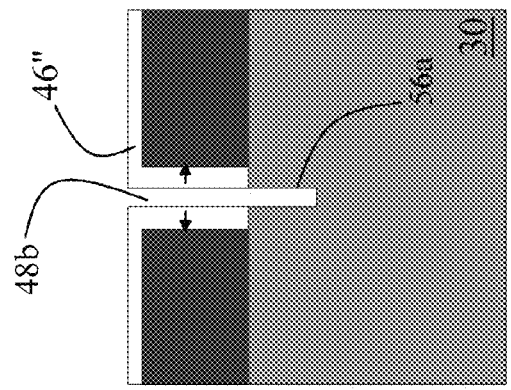
FIGS. 5a-5d are cross sectional views of another embodiment of a process to form the V-shaped grooves in the glass structural support member of FIG. 2c' in which ion etch recipes are alternated and repeated many times, first etching down into the silicon, then etching laterally to widen the mask opening.
Figure 5B:
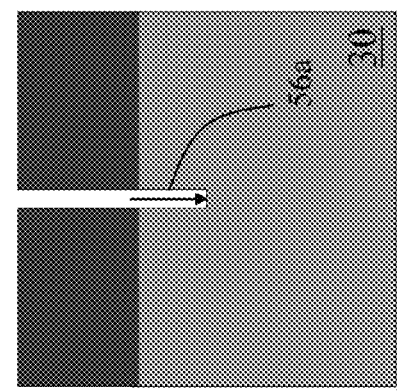
Figure 5A:
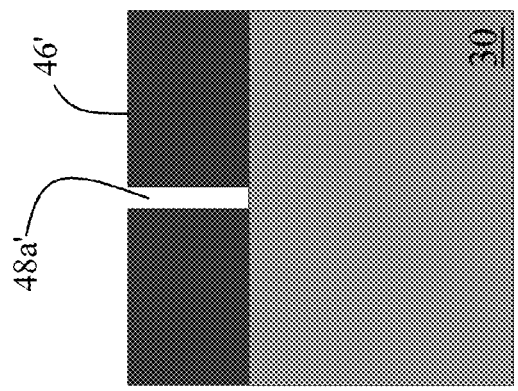

In a variation of the embodiment of FIGS. 4a to 4c, a stepwise process is used, as shown in FIGS. 5a to 5d. After etch masking layer 46' is deposited on glass surface 46 with small opening 48a', as shown in FIG. 5a, a short directional etch provides small trench 56a, as shown in FIG. 5b. Oxygen flow is increased and etch masking layer 46' is then isotropically etched, reducing its thickness, as shown by removed layer 46'' and also increasing the width of opening

Figure 5D:
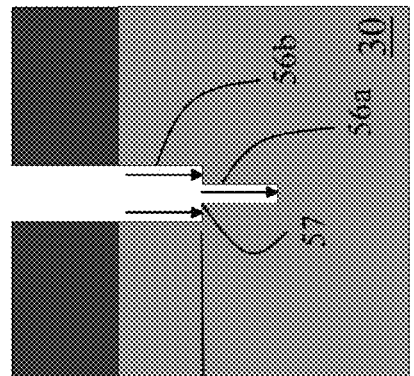
Figure 5D:
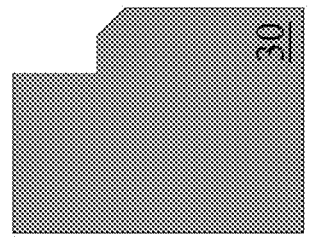

48a' to that of opening 48b, as shown in FIG. 5c. Another directional etch provides small trench 56b over small trench 56a, as shown in FIG. 5d. The high ion energy used for oxide etching will round off any sharp corners 57 on the glass generated by this step-wise process, as shown in the detail view of FIG. 5d'. This step-wise etch mask-widening isotropic etch followed by directional etch is repeated many times to provide the V-groove 32c with tapered sidewalls. Further processing with gaseous HF and NF3 can further smooth out any steps, if needed.

In an alternative to relying on total internal reflection, after grooves 32c are etched but before bonding glass surface 42 to single-crystal silicon front major surface 44, reflective material 58, such as aluminum, copper, or gold, is deposited on glass structural support member surface 42 and on V-groove surfaces 50 within cavity 52. Glass structural support member 30 is then polished to remove reflective material 58 from glass surface 42, leaving reflective material 58 on groove surfaces 50 within cavity 52, as shown in FIG. 1c''.

Figure 6A:
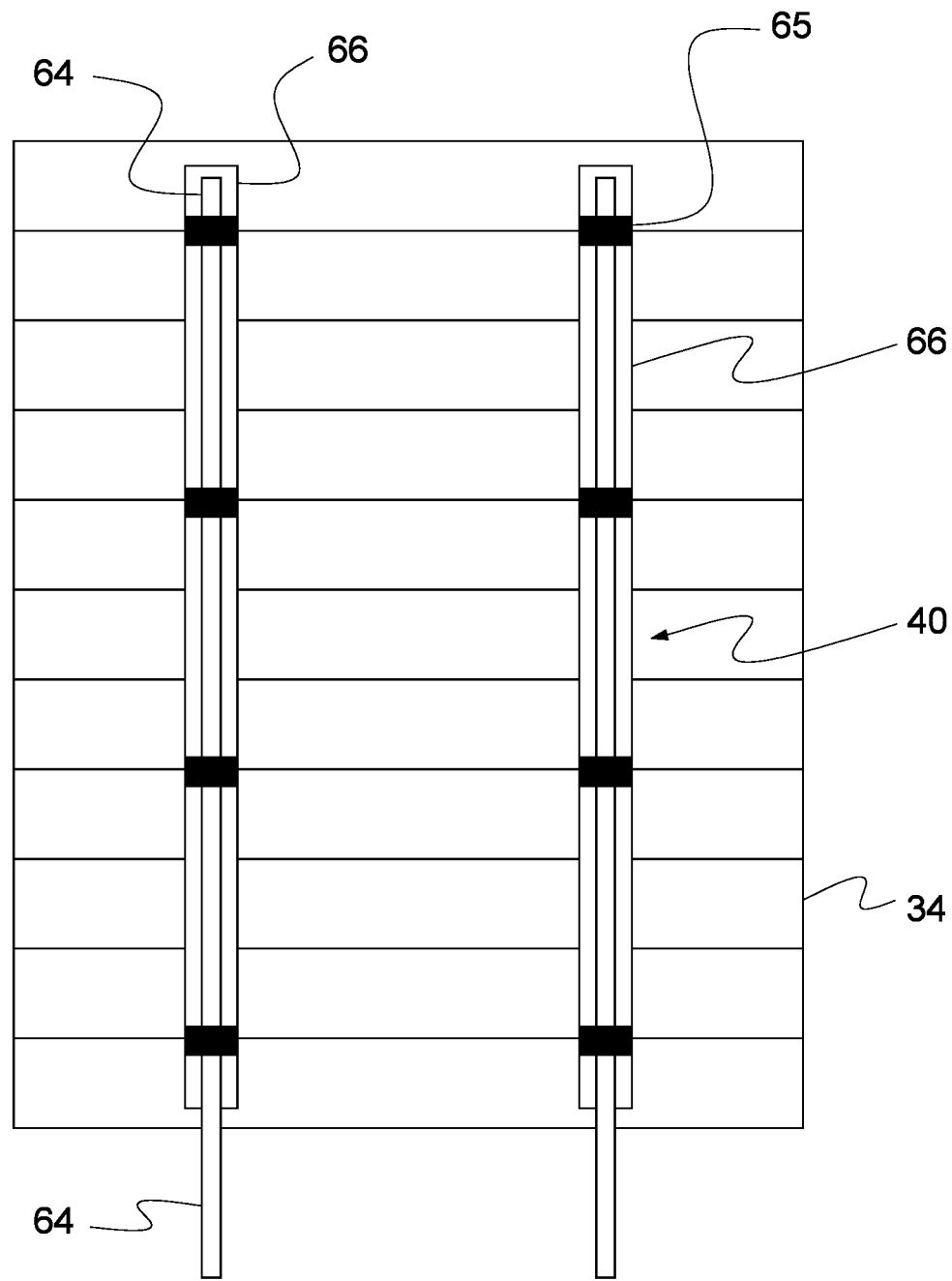
FIG. 6a is a top view of a single-crystal silicon wafer mounted to a glass structural support member in which conductive overtabs contact multiple places along bus bars of the grid metallization and extend beyond the wafer for interconnect with the bottom surface of another single-crystal silicon wafer in a panel.
Figure 6B:
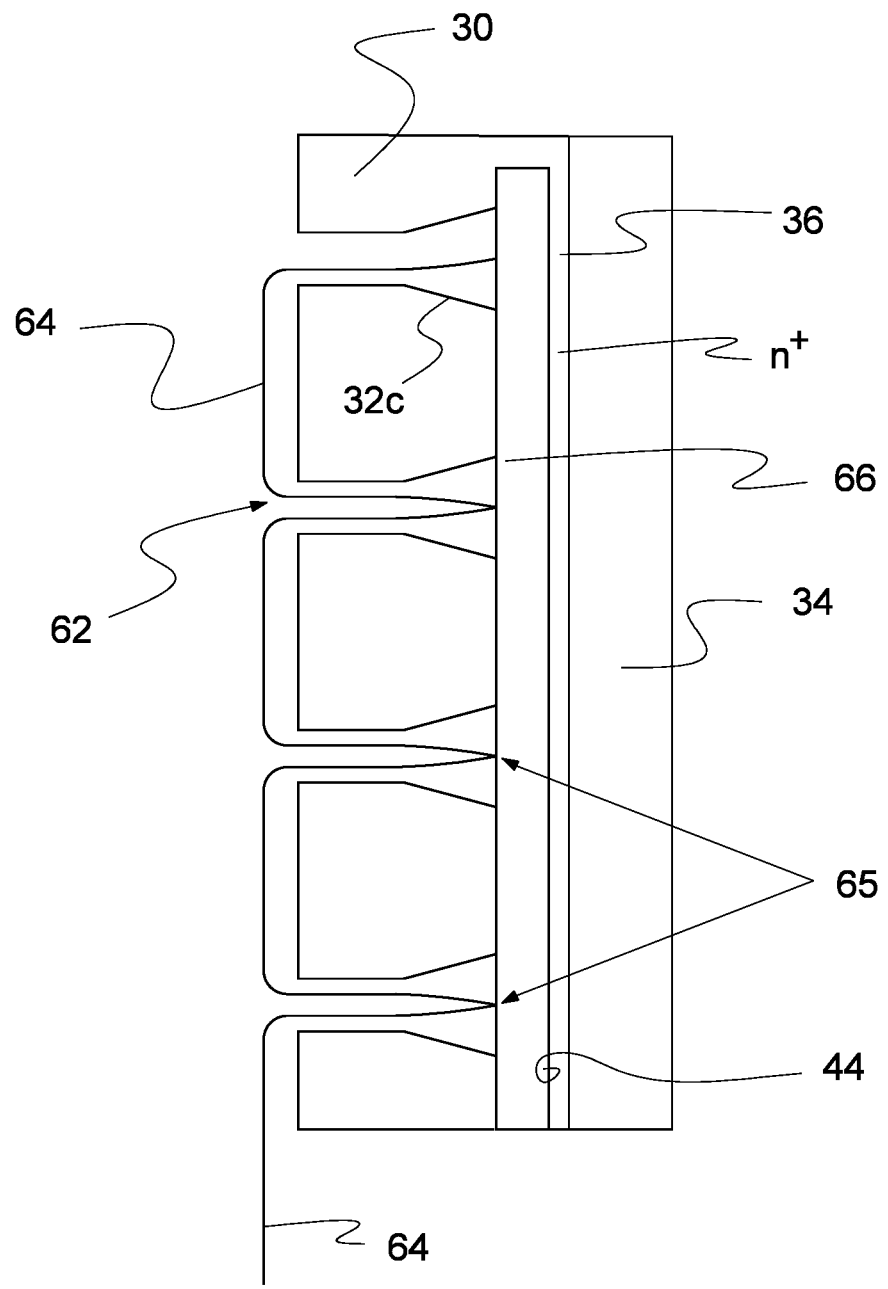
FIG. 6b is a cross sectional view of the single-crystal silicon wafer of FIG. 6a mounted to a glass structural support member of FIG. 6a showing one embodiment of the overtabbing through multiple openings in the glass structural support member, into the V-shaped grooves, for contact to the bus bars in multiple places along the surface of the single-crystal silicon wafer.

In one embodiment, openings 62 are later made in glass structural support member 30 for overtab conductor 64 to connect, such as by soldering or ultrasonic bonding, in multiple places 65 along each bus bar 66 of front surface metalization grid 40, as shown in FIGS. 6a, 6b. In one embodiment, each overtab conductor 64 extends to beyond edge 67 and has a length sufficient for stress relief and contact to the back surface of another cell in a panel (not shown).

Figure 7A:
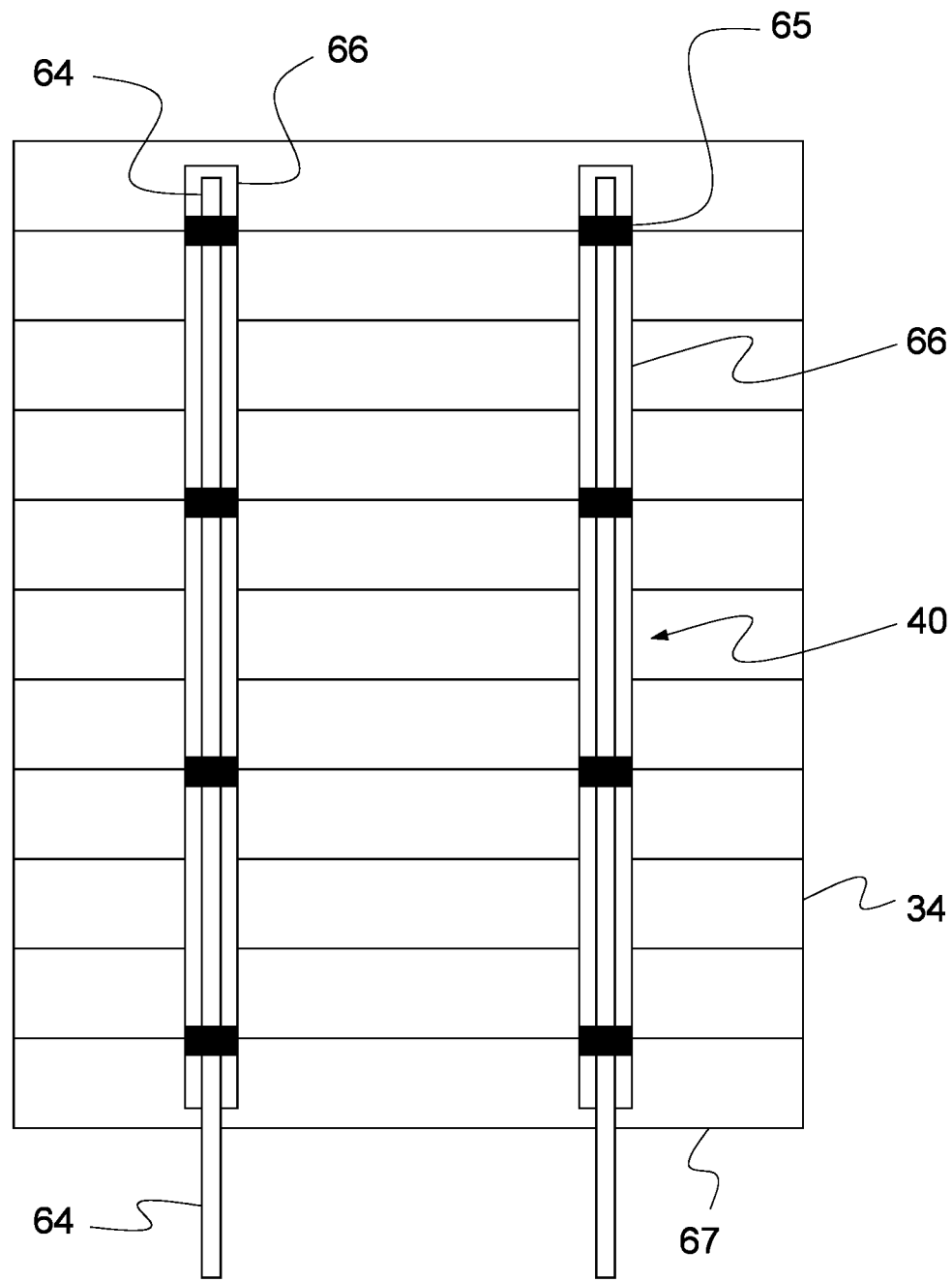
FIGS. 7a-7b are top and cross sectional views respectively of the overtabbing scheme of FIGS. 6a and 6b in which the overtab conductor extends within the V-shaped groove in the glass structural support member and extends beyond the edge of the wafer for interconnection with another single-crystal silicon wafer.
Figure 7B:
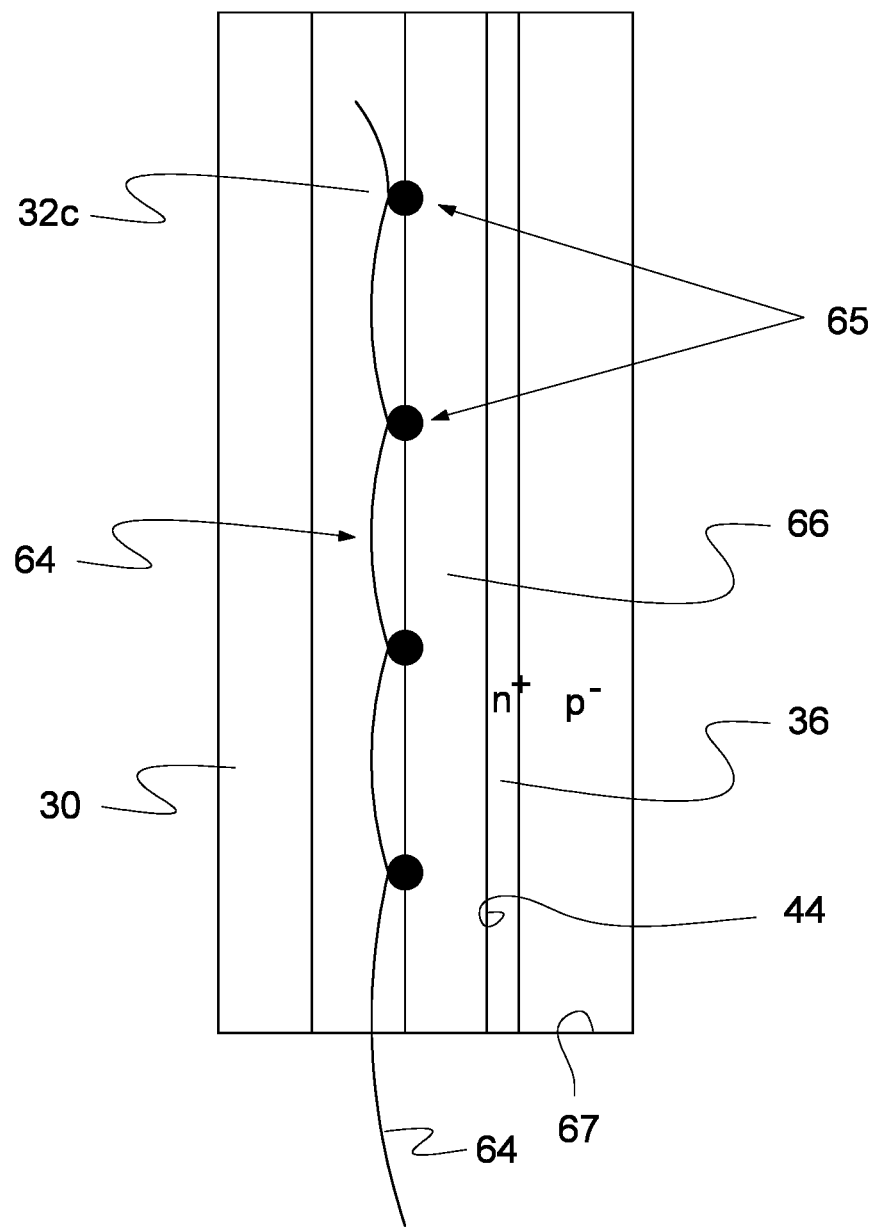

In another embodiment, overtab conductor 64 is soldered or ultrasonic bond-connected in multiple places 65 to each bus bar 66 before glass structural support member 30 is bonded to front surface 44 of single-crystal silicon wafer 34, as shown in FIGS. 7a, 7b. In this embodiment, grooves 32a, 32b, 32c are sized to accommodate the additional 0.1 mm thickness of overtab conductor 64.

Figure 8A:
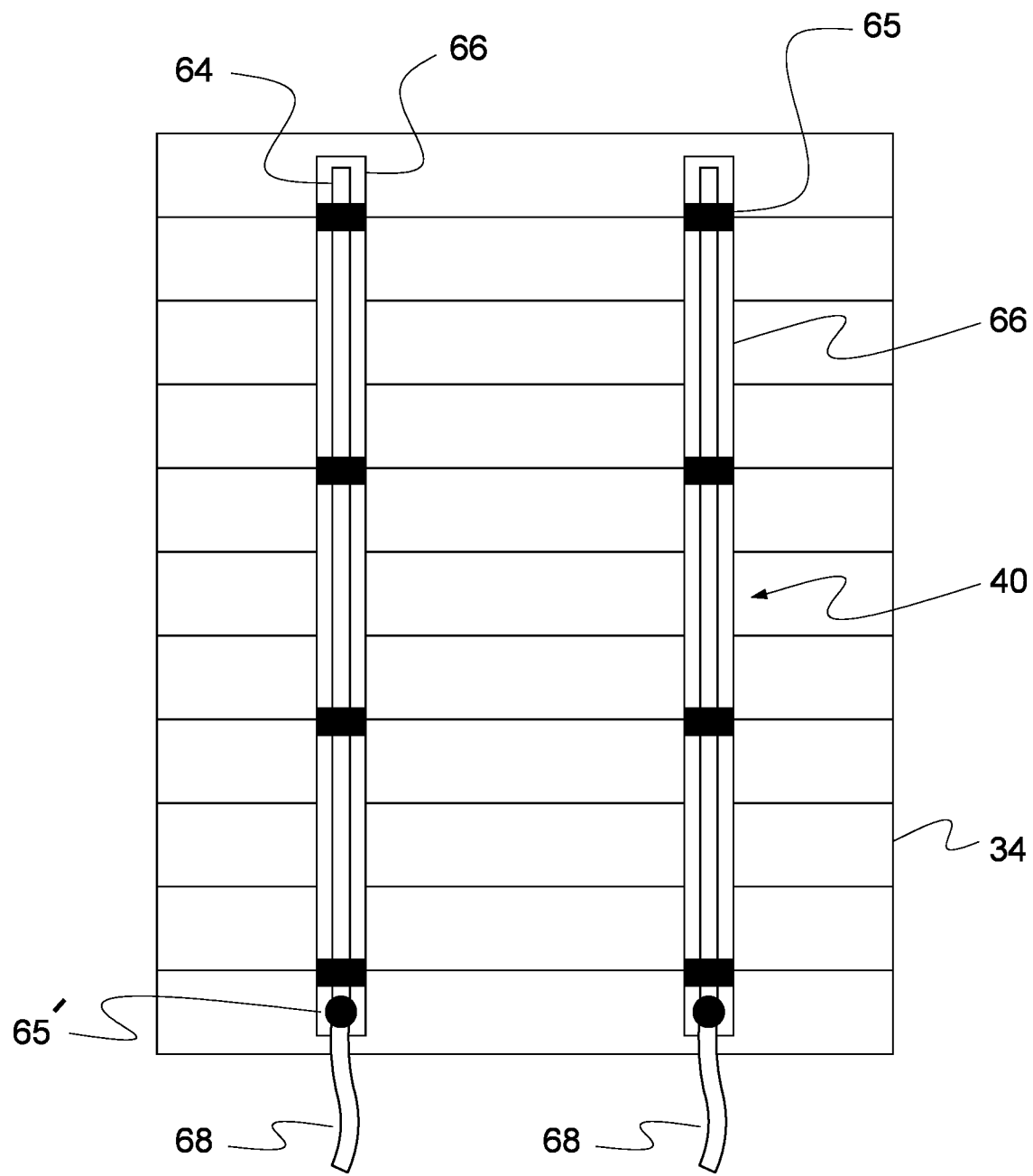
FIGS. 8a-8b are top and cross sectional views respectively of the overtabbing scheme of and FIGS. 7a and 7b in which the overtab foil extends within the V-shaped groove in the glass structural support member and a separate interconnect conductor is bonded to the overtab foil along an edge of the wafer where the structural support member was etched to expose a portion of the bus bars.
Figure 8B:
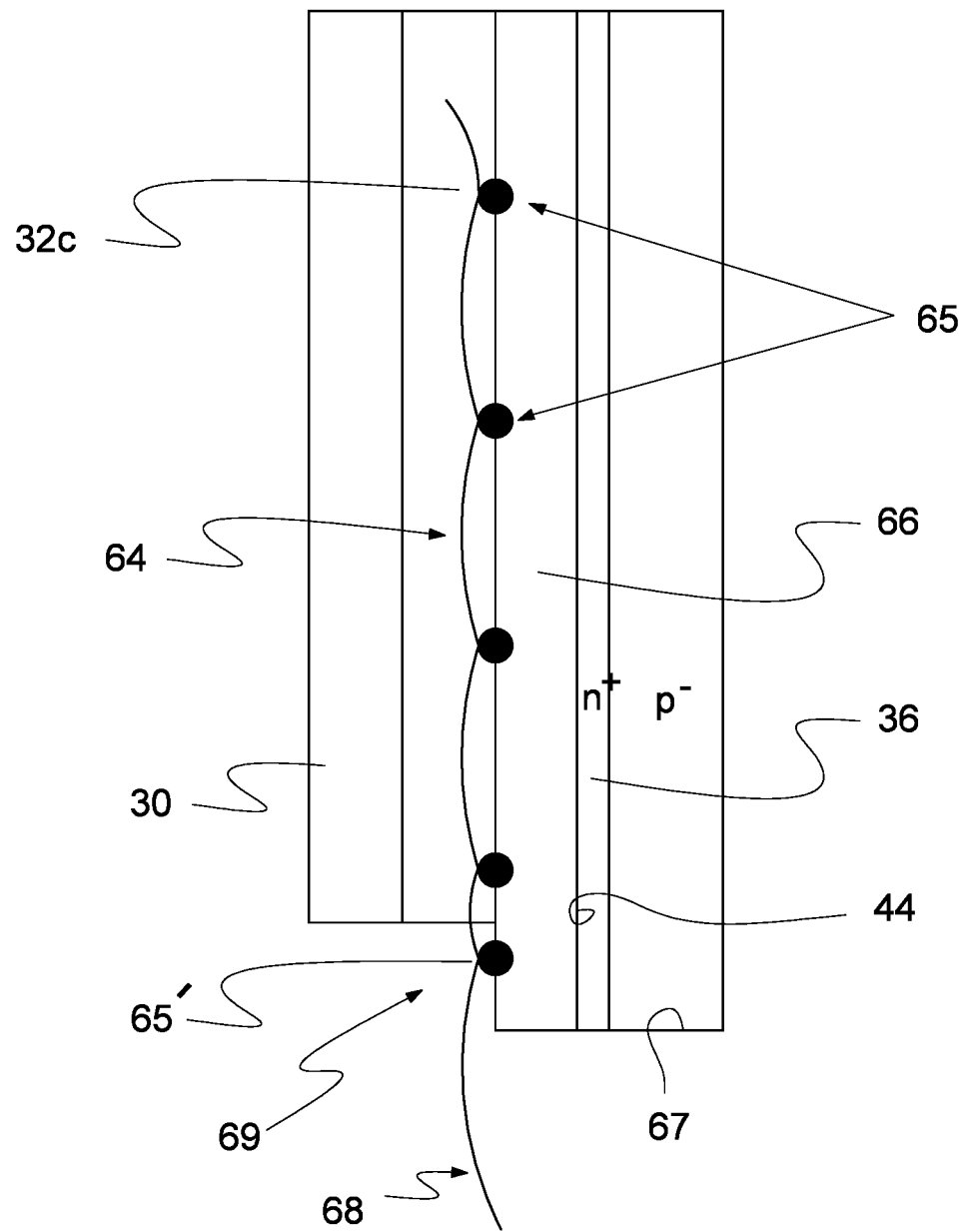

In another version of the embodiment of FIGS. 7a, 7b, overtab conductor 64 does not extend beyond edge 67 of wafer 34, as shown in FIGS. 8a, 8b. After glass structural support member 30 is bonded and cell fabrication is otherwise complete, edge portion 69 of glass structural support member 30 is etched to expose a portion of overtab conductor 64 sufficient for contact. Interconnect tabs 68 are then soldered or ultrasonic bonded 65' to the exposed portion of the overtab conductor 64 on each bus bar 66.

Figure 9:
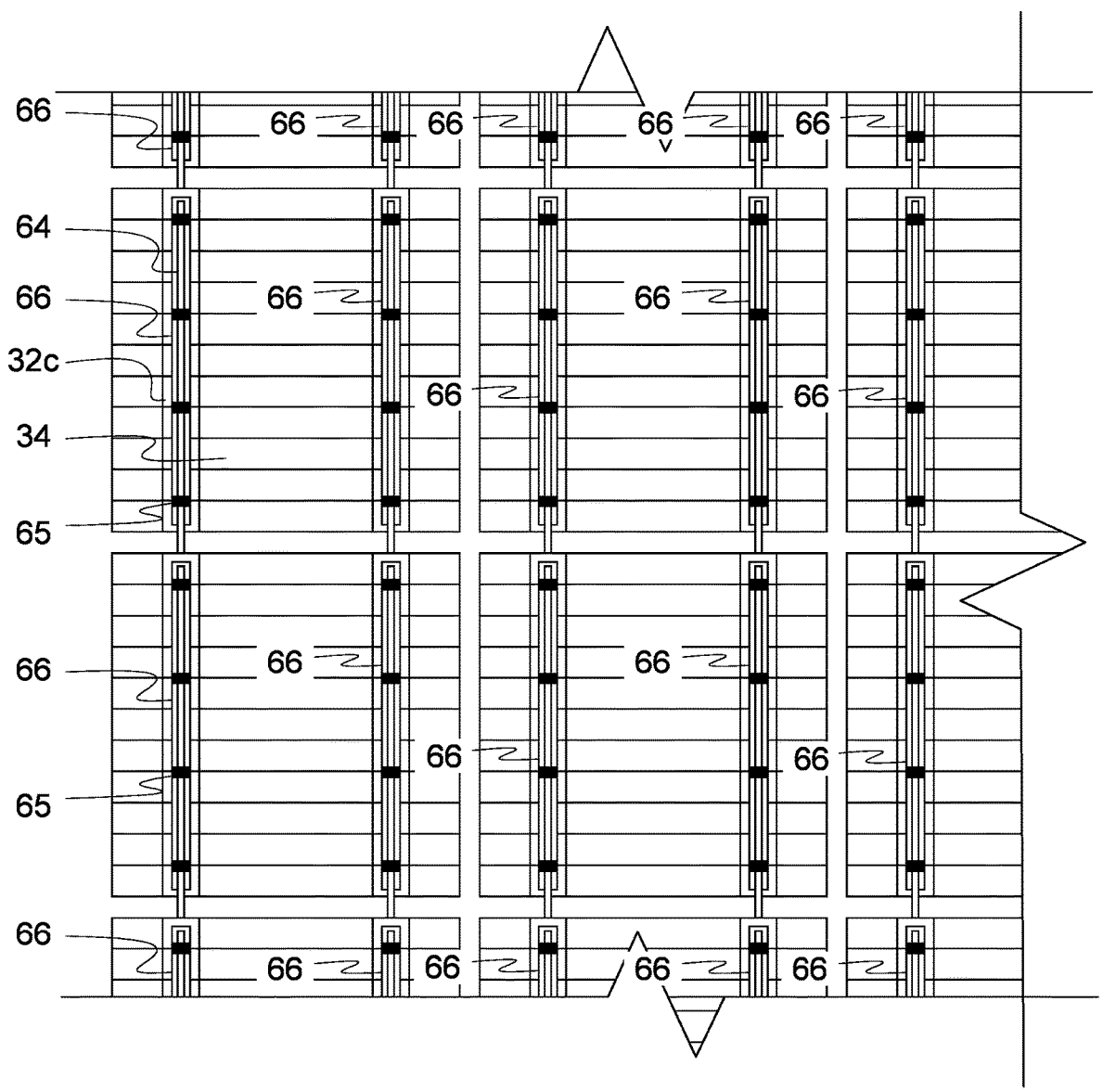
FIG. 9 is a top view of a portion of a panel-sized glass structural support member supporting a plurality of wafers, in which grid metalization of the wafers is in V-shaped grooves in the panel-sized structural support member in which conductive overtabs contact multiple places along bus bars of the grid metallization and extend beyond the wafer for interconnect with the bottom surface of another single-crystal silicon wafer in a panel.

In one embodiment, grooves 32a, 32b, or 32c are etched in panel-sized glass structural support member, which is configured to support a plurality of single-crystal silicon wafers 34, as shown in FIG. 9. Grid metallization 40 of each single-crystal silicon wafer 34 is located within corresponding grooves 32a, 32b, or 32c of panel-sized glass structural support member.

In one embodiment the bonding of individual-wafer-sized or panel-sized glass structural support member 30 to single-crystal silicon surface 44 of wafer(s) 34 includes anodic bonding using a process described in commonly assigned U.S. Pat. No. 10,589,445 ("the '445 patent"), incorporated herein by reference.

Figure 10B:
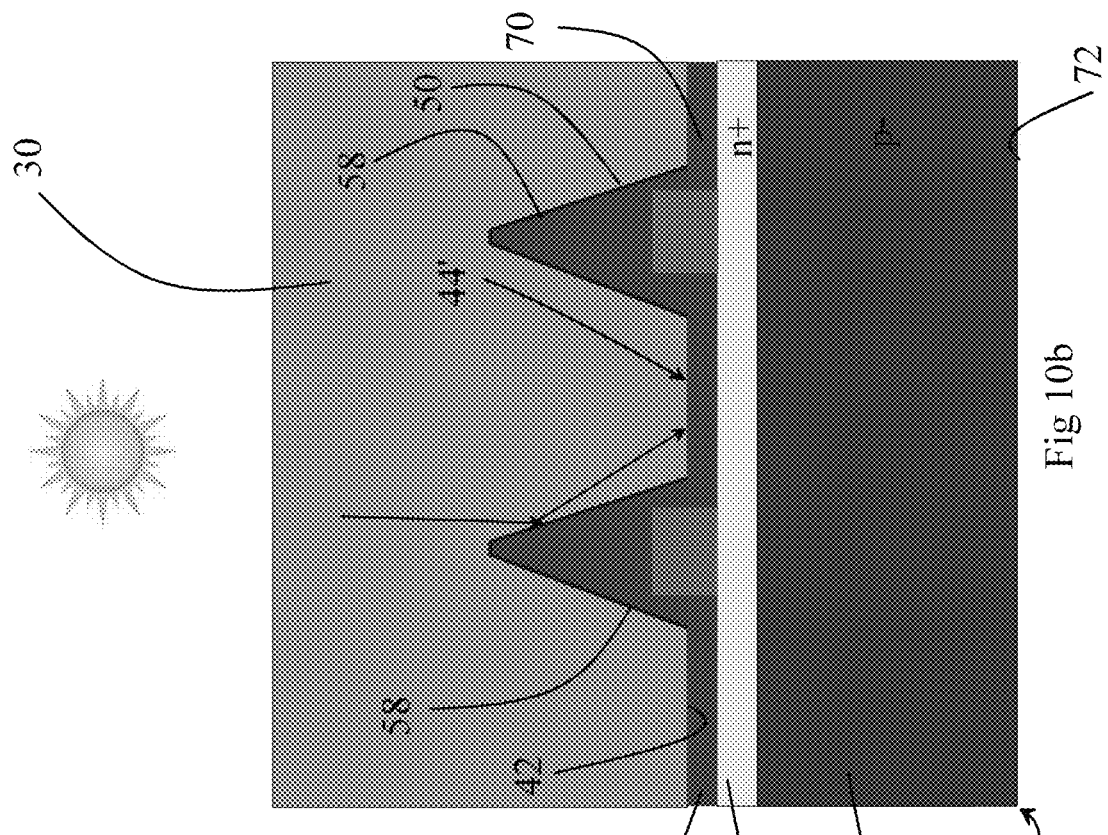
FIGS. 10a and 10b are cross sectional views showing a single-crystal silicon wafer with front surface diffusions and metallization grids bonded with transparent epoxy to a structural support member of FIGS. 2c' and 2c"
Figure 10A:
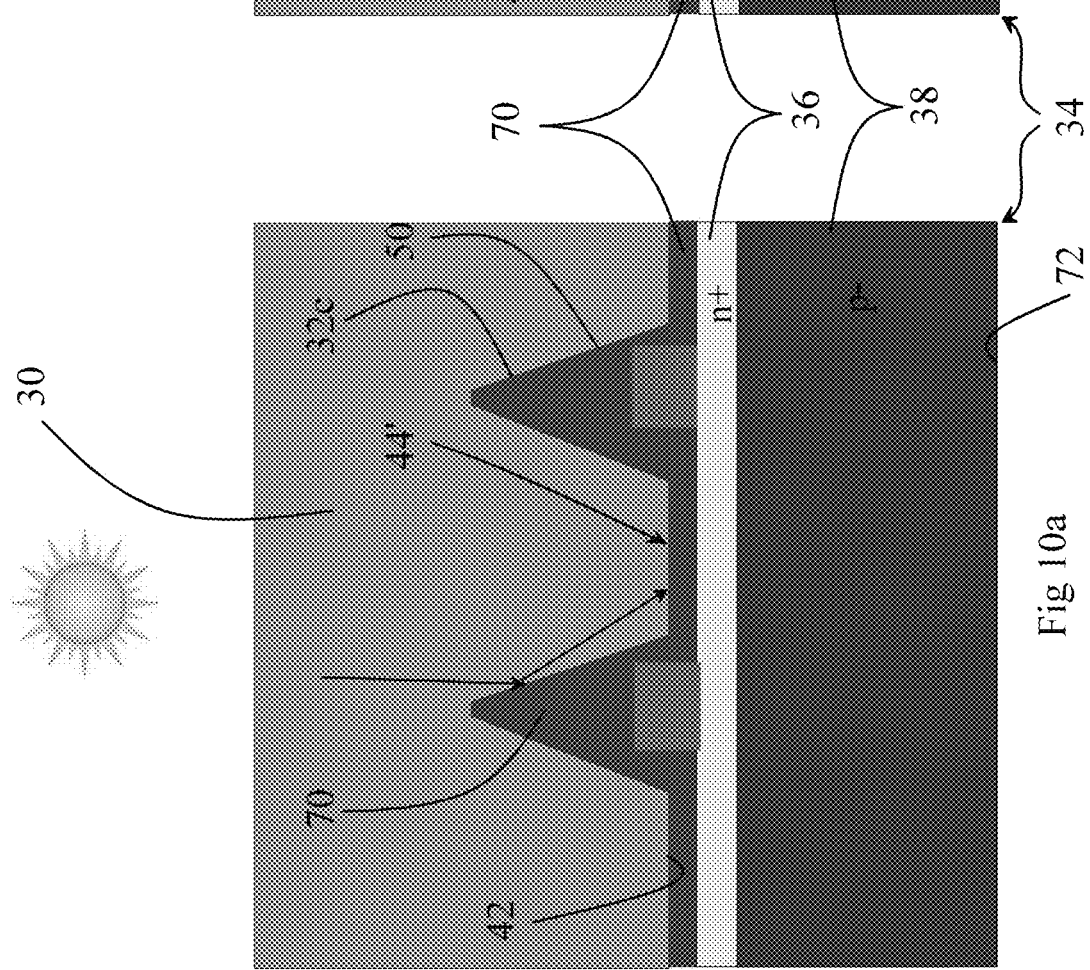

In another embodiment the bonding of individual-wafer-sized or panel-sized glass structural support member 30 to single-crystal silicon surface(s) 44 of wafer(s) 34 includes bonding with transparent epoxy 70, as shown in FIGS. 10a, 10b.

Transparent epoxy 70 may fill V-shaped grooves 32c and extend between surfaces 42 and 44 of structural support member 30 and single-crystal wafer 34. Light incident on V-shaped groove 32c is total internal reflected, as shown in FIG. 10a, or directed by reflective material 58 on groove surfaces 50 within V-shaped groove 32c toward adjacent single-crystal silicon surface 44', as shown in FIG. 10b.

In one embodiment, after bonding wafer(s) 34 to wafer-sized or panel-sized glass structural support member 30, thickness of single-crystal silicon wafer 34 is reduced by grinding and polishing back major surface 72 of single-crystal silicon wafer(s) 34.

In another embodiment thickness of single-crystal silicon wafer(s) 34 is reduced with NaOH or KOH, which etches exposed back major surface(s) 72 of single-crystal silicon wafer(s) 34. Wafer-sized or panel-sized glass structural support member 30 provides support for each such thinned single-crystal silicon wafer 34 and protects their front surface 44 from being etched by NaOH or KOH. As it is bonded to glass structural support member 30, thinned single-crystal silicon wafer 34 remains durable and planar down to a thickness of 20 microns or less.

The grinding, polishing or etching of back major surface 72 can be performed on full-thickness wafers or on wafers that were previously cleaved using a process, such as that described in the '445 patent.

In another embodiment, both sides 73a, 73b of single-crystal silicon wafer 34 are provided with inverted pyramids, as shown in FIG. 1, and with photovoltaic cell diffusions 36 and front surface metalization grid 40 in advance of the glass bonding step, as shown in FIG. 11a. Glass structural support members 30a, 30b, each with grooves 32a, 32b, or 32c positioned to mirror metalization grid 40 are bonded to sides 73a, 73b of single-crystal silicon wafer 34 respectively, fitting over front surface metalization grid 40 on each side 73a, 73b, as shown in FIG. 11b. The process to anodically bond glass structural support members 30a, 30b to silicon surfaces on both sides 73a, 73b of a single-crystal silicon wafer 34 described in the '445 patent is used.

Single-crystal silicon wafer 34, bonded to glass structural support members 30a, 30b, is then cleaved according to the process described in the '445 patent to provide two thinner single-crystal silicon wafers 34a, 34b, as shown in FIG. 11c. Thus, if starting single-crystal silicon wafer 34 was 180 micrometers thick, each cleaved single-crystal silicon wafer 34a, 34b is 90 micrometers thick.

In one embodiment, the cleaving process of the '445 patent is enhanced by providing an asymmetric stress across the cell during the cooling step in addition to the stress provided by the thermal expansion difference between single-crystal silicon wafer 34 and glass structural support member 30a and between single-crystal silicon wafer and glass structural support member 30b.

Figure 12A:
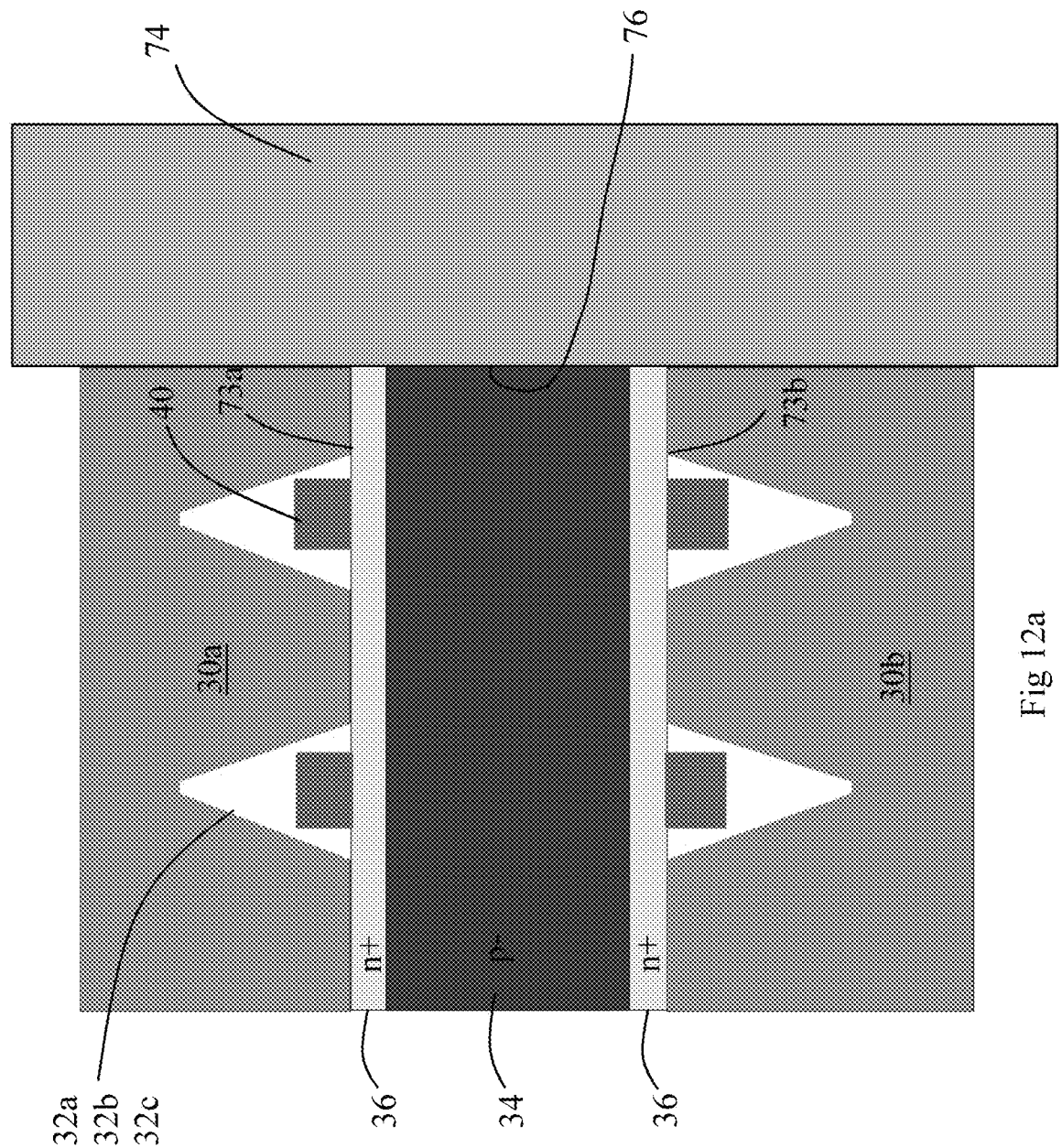
FIGS. 12a and 12b are cross sectional views showing a single-crystal silicon wafer of FIG. 11b in which the wafer was cleaved with asymmetric force provided by one or two cooling elements respectively.
Figure 12B:
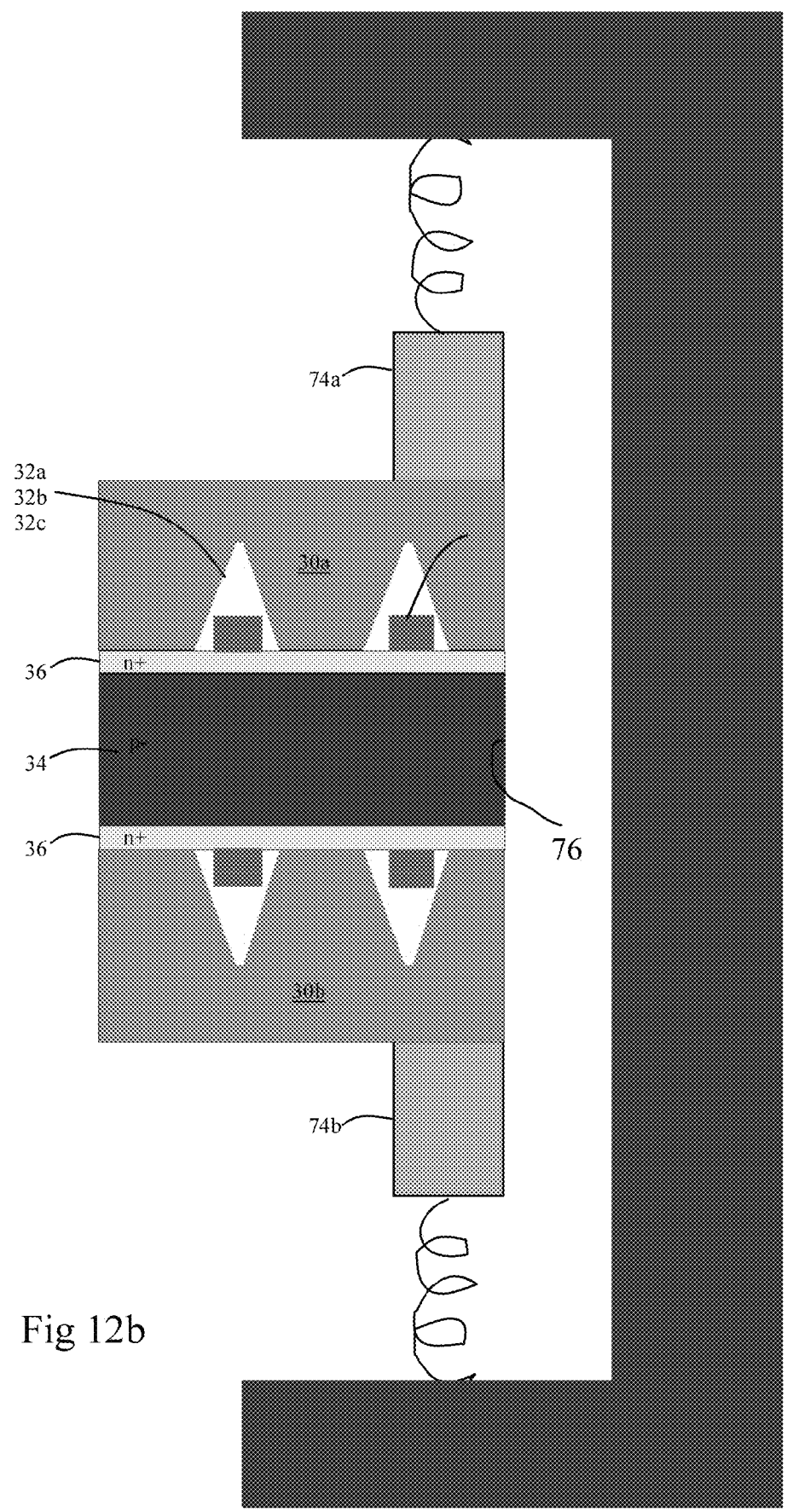

The asymmetric stress may be provided with a thermal gradient, as shown in FIGS. 12a, 12b, for an individual wafer. In one embodiment, cooling element 74 touches portion 76 of edge of single-crystal silicon wafer 34 and corresponding portions of edges of structural support members 30a, 30b, to provide the thermal gradient, as shown in FIG. 12a. A metal bar or a metal box containing dry ice or liquid nitrogen can be used for cooling element 74. In an alternative, a pair of spring-loaded cooling elements 74a, 74b contact structural support members 30a, 30b adjacent portion 76 of the edge of single-crystal silicon wafer 34, as shown in FIG. 12b. Cleaving initiates at the coolest spot, which is portion 76 of the edge of single-crystal silicon wafer 34, and propagates across single-crystal silicon wafer 34.

While with uniform cooling, the difference in thermal expansion coefficient causes stress to increase linearly from zero at the center of the wafer to a maximum at the single-crystal silicon wafer edge, the addition of thermal asymmetric stress, as shown in FIGS. 12a, 12b moves the location of zero stress toward the portion of wafer edge opposite cleavage initiation site, portion 76 of the edge of single-crystal silicon wafer 34. With sufficient thermal gradient, the location of zero stress can be moved entirely across and off that opposite edge of single-crystal silicon wafer. Thus, with sufficient thermal gradient, crack propagation is forced across the entire wafer. With the region of zero forcing that allows crack propagation to wander removed, a smoother cleaved surface for both resulting wafers is achieved.

The thermal gradient can be provided to each squared-off wafer of a panel of wafers bonded between glass panels. In one embodiment, the asymmetric cooling is provided by pairs of row-sized spring-loaded cooling elements 74' contacting top and bottom panel-sized structural support members 30a, 30b adjacent edges 76' of single-crystal silicon wafers 34 in each row, as shown in FIGS. 13a, 13a'.

Alternatively, pairs of spring-loaded cooling elements 74" are sized to contact top and bottom panel-sized structural support members 30a, 30b adjacent only corners 76" of single-crystal silicon wafers 34, as shown in FIG. 13b, 13b'.

Either way, cleaving initiates where each wafer 34 is coolest and cleaving propagates across all the wafers in the panel at once, to provide two separate panels, each populated with the cleaved cells.

Figure 14A:
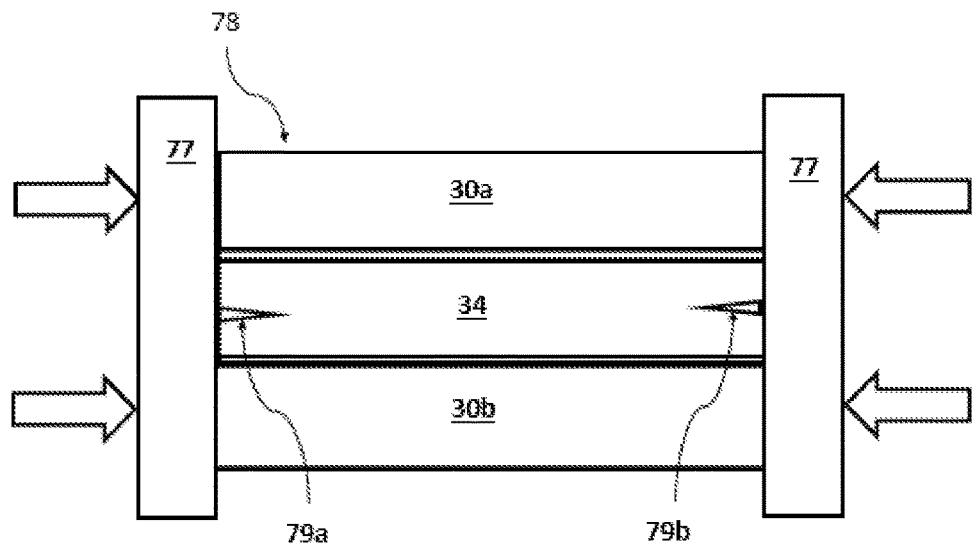
FIG. 14a is a cross sectional view of the single-crystal silicon wafer of FIG. 11b in which the wafer is cleaved by applying mechanical force and relying on the Young's Modulus difference between glass and silicon to initiate and propagate a crack to form two thinner single-crystal silicon wafers.

Stress can also be provided by physically applying a mechanical force through chucks 77 on assembly 78, which includes square or rectangular wafer 34 anodic- or epoxy-bonded to glass structural support members 30a, 30b, as shown in FIG. 14a. The strain provided by the mechanical force in glass structural support members 30a, 30b is identical to the strain in silicon wafer 34 but the stress in silicon wafer 34 is twice that in glass structural support members 30a, 30b due to the Young's Modulus difference between silicon and glass. As mechanical force increases, cleaving of silicon wafer 34 initiates with crack 79a, 79b along either or both wafer edges, and crack 79a, 79b propagates across silicon wafer 34 to provide stress relief.

Figure 14B:
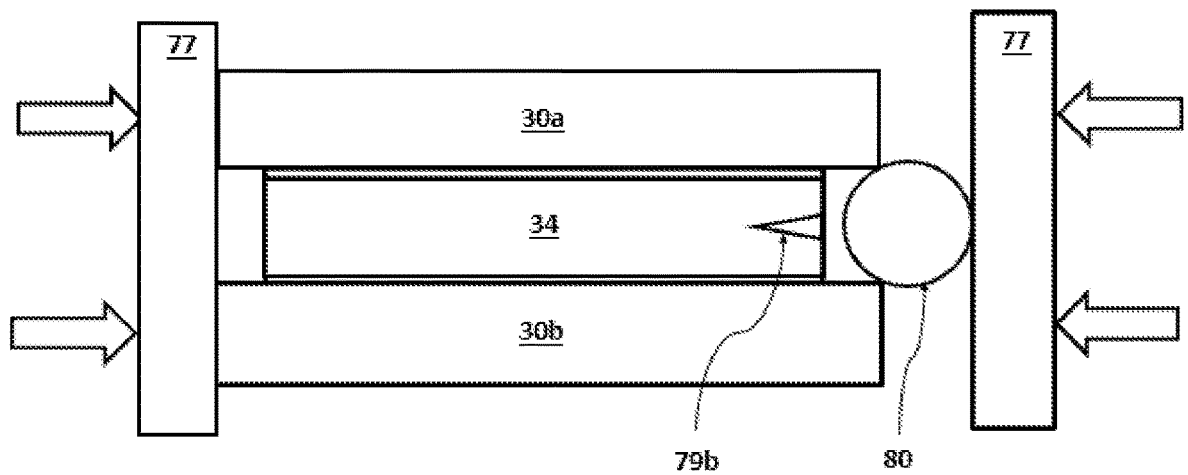
FIG. 14b is a cross sectional view of the single-crystal silicon wafer of FIG. 11b in which the wafer is cleaved by pushing apart the glass structural support members to initiate and propagate a crack to form two thinner single-crystal silicon wafers.

In another embodiment, glass structural support members 30a, 30b are slightly wider than silicon wafer 34, as shown in FIG. 14b. As mechanical force is applied with chuck 77, ball, roller, or wedge 80 pushes glass structural support members 30a, 30b apart, initiating crack 79b. A single ball or a line of such balls can be used. As ball or roller 80 continues to push glass structural support members 30a, 30b apart, crack 79b propagates across silicon wafer 34 to provide stress relief. For example, for a silicon wafer that is 160 micrometers thick, ball or roller 80 has a diameter in the range from about 180 to about 220 micrometers.

Each thinner single-crystal silicon wafer 34a, 34b so formed remains bonded to its own glass structural support member 30a, 30b and can be further thinned by grinding and polishing or by emersion in NaOH. Alternatively, the diffusion, metalization, and bonding process of FIGS. 11a-11b can be repeated on the cleaved sides and then the cleaving shown in FIG. 11c repeated for each thinned wafer 34a, 34b to provide yet further thinned single-crystal silicon wafers mounted to structural support members.

Figure 15B:
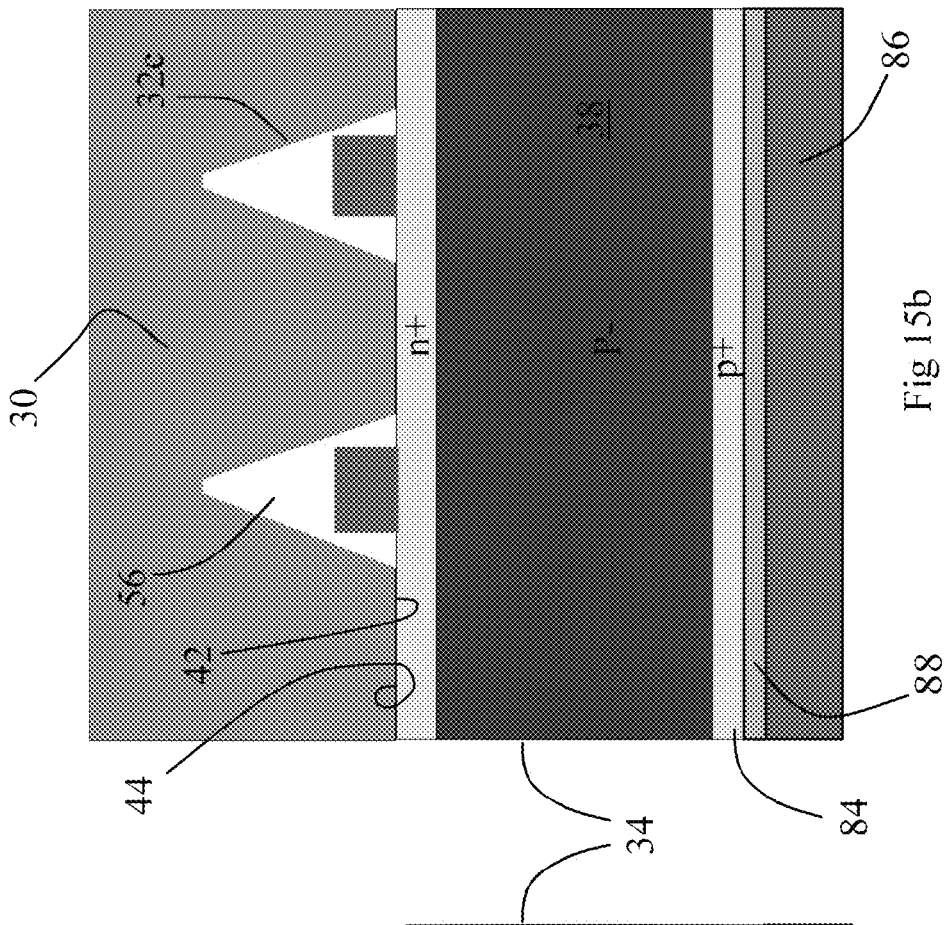
FIG. 15b is a cross sectional view showing the glass structural support member mounted on the single-crystal silicon wafer of FIG. 15a in which the wafer has a back surface field, a passivation layer, and a back surface conductor.
Figure 15A:
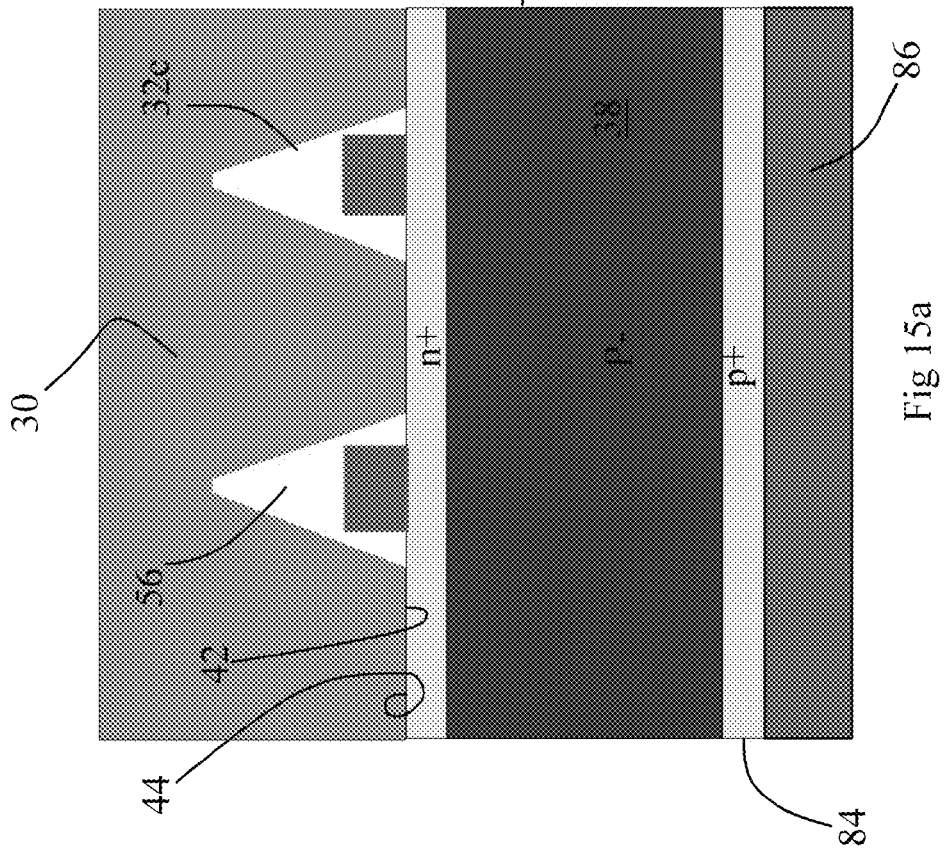
FIG. 15a is a cross sectional view showing a glass structural support member mounted on a single-crystal silicon wafer in which the wafer has a back surface field and a back surface conductor.

In one embodiment, exposed single-crystal silicon back surface 72 of each thinned wafer 34 is then processed to provide aluminum silicide back surface field 84 and metallic aluminum light reflector and back surface contact 86, as shown in FIG. 15a.

In one embodiment a sheet of aluminum on single-crystal silicon back major surface 72 is annealed under nitrogen or in vacuum to provide the source for back surface field aluminum silicide Al4Si3 p+ layer 84 and for aluminum light reflector and back surface aluminum contact 86. Unreacted metallic aluminum 86 provides the back surface reflector on aluminum silicide layer 84 and provides the back surface contact. In another embodiment, aluminum paste is screen printed, coating back major surface 72, and annealed to provide these layers.

Aluminum back surface reflector 86 reflects light passing through the single-crystal silicon wafer 34 back toward its front surface 44, thus providing the light with another pass through single-crystal silicon substrate 38. If front surface 44 has the inverted pyramids of FIGS. 1a to 1d light reflected from back surface reflector 86 reaching front surface 44 will be reflected again for another pass through single-crystal silicon substrate 38. Thus, once light enters single-crystal silicon substrate 38, back surface reflector 86 and inverted pyramids on front surface 44 provide light trapping, causing the light to traverse multiple passes through single-crystal silicon substrate 38 where it is eventually all absorbed, with each absorbed photon producing an electron-hole pair.

In another embodiment passivation layer 88, such as $Al_2O_3$ capped with $SiN_x$ is formed between aluminum silicide p+ back surface field 84, and back surface contact 88, as shown in FIG. 15b, and as described in the paper, "Crystalline Single-crystal silicon PERC Solar Cell with Ozonized AlOx Passivation Layer on the Rear Side," Pang-Kai Liu, Yu-Lun Cheng, and Likarn Wang, *International Journal of Photoenergy*, Volume 2020, Article ID 6686797 Dec. 4, 2020. Laser ablation is used to form pinhole openings through the $Al_2O_3$ dielectric for contacts. Screen printed aluminum is then used for the back surface contact to the ultra thin solar cell. In one alternative, a photolithographic process can be used instead of the laser ablation. The rear surface passivation and the substantial reduction in rear surface recombination, contribute to substantially improved efficiency of thinned solar cells.

Substantial efficiency improvement is also found by increasing the path length of light reflected from the back surface, such as by providing a back surface texturing to direct light into an oblique angle or by using diffraction with a back surface grating, as described in "Improving Thin-film Crystalline Silicon Solar Cell Efficiencies with Photonic Crystals," *Optics Express*, Vol. 15, No. 25/10 Dec. 2007.

For interconnects, ultrasonic bonding of aluminum foil to front surface silver busbars and to back surface aluminum contact and structural support member 86 can be used, as described in the paper, "Ultrasonic Bonding of Aluminum Ribbons to Interconnect High-Efficiency Crystalline-Single-crystal silicon Solar Cells," by M. Heimann, et al. *Energy Procedia* 27 (2012) 670-675.

In another embodiment, back surface structural support member 90 is used, as shown in FIGS. 16a-16g. After emitter diffusion 36 is formed, protective layer 92, such as resist or polyimide, is spun on to protect diffusion 36 and side edge 94, as shown in FIG. 16b. 5 micrometers of polyimide provides protection while exposed back surface 72 of FIG. 16c is etched in NaOH or KOH to provide ultra-thinned single-crystal silicon wafer 34', as shown in FIG. 16d. In one embodiment, during the NaOH or KOH etch of its back surface 72, wafer 34 is supported in recess-chuck 96, as shown in FIG. 16c.

NaOH or KOH is then drained from the NaOH or KOH bath. Exposed portions of polyimide front surface protective layer 92 are removed, as shown in FIG. 16e, such as with a wet etch while wafer 34 continues to be supported in recess-chuck 96. A wet etch in Caro's acid, Peroxymonosulfuric acid, H2SO5, will remove the polyimide. Alternatively a plasma etch in the range of 200 to 300 microns pressure in a mixture of argon and oxygen at room temperature can be used. An elevated temperature of up to 250 C during the plasma etch will more quickly remove the polyimide.

In another alternative, front surface protective layer 92 of FIG. 16b is a sacrificial structural support member, such as glass, bonded to front surface 44 of wafer 34. With front-surface sacrificial structural support members on each wafer, support in recess-chuck 96 is not needed, and back surfaces 72 of an entire boat load of wafers can be simultaneously etched in NaOH or KOH while the sacrificial structural support members on each wafer protects and maintains durability for the boat load of thinned wafers.

Metal sheet 98, such as aluminum, and exposed single-crystal silicon back surface 72 are each then cleaned in a non-oxidizing ambient to remove respective oxide films, and the two cleaned surfaces are pressed together at a temperature of 200 C, as shown in FIG. 16f, to form aluminum silicide back surface field 102. Remaining unreacted portion of metal sheet 98 provides back surface reflector, back surface contact, and back surface metal structural support member 90, as shown in FIG. 16g. Other metals and their silicides, such as tungsten, can also be used.

If the sacrificial front surface structural support member was used for front surface protective layer 92, it is no longer needed for durability of the thinned single-crystal silicon once metal sheet 98 is bonded to single-crystal silicon back surface 72. Sacrificial front surface structural support member is then etched, exposing diffused surface 34 for further solar cell processing.

If a metal with a high melting point, such as tungsten, is used for back surface metal structural support member 90, the process can be modified, with the option to do the front surface diffusion after the back surface processing is complete. In this embodiment, tungsten back surface structural support member 90 is anodically bonded to back surface 72 of wafer 34. With such a back surface structural support member in place, front surface 44 is thinned using one of the methods described herein above. If with NaOH or KOH, a boatload of wafers can be thinned at once. Standard solar cell front surface processing including etching pyramids, diffusion and metalization are provided on front surface of the resulting thinned single-crystal silicon mounted on tungsten back surface structural support member 90. During the high-temperature front surface diffusion, tungsten silicide back surface field is automatically formed and remaining tungsten back surface structural support member 90 provides back surface reflector and back surface contact for interconnection with an adjacent wafer as well as structural support for the thinned single-crystal silicon wafer 34'.

In other embodiments, Damascene-recessed metalization electrical conductor 130 is provided in single-crystal silicon 34' before bonding to ungrooved glass structural support member 30', as shown in FIGS. 17a-17i, 18a-18d, and 19a-19d.

In the embodiment with Damascene-recessed metalization electrical conductor 130, single-crystal silicon 34 has photovoltaic cell diffusion 36 provided to surface 44 in bulk single-crystal silicon substrate 38 and polish stop layer 122, such as single-crystal silicon nitride, titanium nitride or tantalum nitride is deposited as shown in FIG. 17a. After a screen-printed grid pattern mask deposition, trenches 124 are etched, as shown in FIG. 17b. Alternatively, grid pattern masking for trenches 124 may be provided with contact printing on spun on or sprayed photoresist. The directional etching of the single-crystal silicon, as so masked, extends through polish stop 122, n+ diffusion 36, and into p-bulk single-crystal silicon substrate 38 to a depth suitable for grid pattern conductors, which will later fill trenches 124.

Dopant source layer 126, such as phosphosilicate glass, is then conformally deposited on all exposed surfaces by a process such as chemical vapor deposition, as shown in FIG. 17c. Phosphorus diffuses from dopant source layer 126 into single-crystal silicon surface 44' in trenches 124 during an anneal at 1050 degrees for 5 minutes to provide second n+ diffusion 36' in single-crystal silicon extending along trench sidewalls 124', as shown in FIG. 17d. Dopant source layer 126 is then stripped, as also shown in FIG. 17d.

Electrical conductor 130, such as aluminum or silver is then blanket deposited by a method, such as screen printing, evaporation, or sputtering, coating polish stop layer 122 and filling trenches 124, as shown in FIG. 17e. Silver, copper, or another conductor can be used. Tapering trenches 124 and/or reflowing metal facilitates use of screen printing. In the next step, electrical conductor 130 is polished down to polish stop layer 122, leaving electrical conductor 130 in trenches 122 and in electrical contact with diffusion 36' in trenches 122, as shown in FIG. 17f. Alternatively, an etch can be used to remove conductor 130 from polish stop layer 122 instead of the polishing step, leaving conductor 130 in trenches 122. Single-crystal silicon nitride polish stop layer 122 is then removed in a phosphoric acid bath, as shown in FIG. 17g. A dry etch can also be used. A starting process would be 100 sccm N2, 100 sccm O2, and 20 sccm CF4, 100 um pressure, power set to provide a DC voltage of −250V. A touch up polish then removes portion 130' of electrical conductor 130 extending above surface 44 of single-crystal silicon 34', as shown in FIG. 17h.

Planar glass structural support member 30' is then bonded to front surface 44 of single-crystal silicon wafer 34', with its Damascene metalization electrical conductor 130, as shown in FIG. 17i. One or more openings in glass structural support member 30' are etched for wire bonded or soldered contacts to grid metalization bus bars.

In an alternative, glass structural support member 30 with grooves 32c that have an inverted V-angled cross section is used to reflect incident sunlight that would otherwise be incident on Damascene metalization electrical conductor 130 toward adjacent single-crystal silicon surface 44', as shown in FIG. 2c'.

In an alternative, once dopant source layer 126 is etched away, as shown in FIG. 17d, diffusion barrier layer 134, such as single-crystal silicon nitride, is formed, as shown in FIG. 18a. Diffusion barrier layer 134 has a thickness in the range 0.1 um to 0.4 um. Diffusion barrier layer 134 seals in the metal, preventing metal from diffusing through the glass above and interfering with the p-n junction. Diffusion barrier layer 134 also protects conductor 130 during anodic bonding.

Electrical conductor 130 is then blanket deposited filling trenches 124, as shown in FIG. 18b and polished down to polish stop layer (not shown) on front surface 44 of single-crystal silicon 34, leaving electrical conductor 130 filling trenches 124 and in electrical contact with diffusion 36' in trenches 124 through diffusion barrier layer 134, as shown in FIG. 18c. Single-crystal silicon nitride polish stop layer 122 is removed in a phosphoric acid bath and electrical conductor extending above surface 34' is polished. Planar glass structural support member 30' is then bonded to front surface 44 of single-crystal silicon wafer 34', with its Damascene electrical conductor 130, as shown in FIG. 18d.

If a material that does not degrade electrical characteristics of single-crystal silicon, such as silver, is used then no diffusion barrier is needed.

In another alternative, once electrical conductor 130 is polished to front surface 44 of single-crystal silicon 34', as shown in FIG. 18c, electrical conductor 130 is recess etched, as shown in FIG. 19a, second diffusion barrier 140, such as tantalum nitride, is deposited, as shown in FIG. 19b. Second diffusion barrier 140 may be atomic layer deposited to a thickness of 25 Angstroms. It can also be sputtered or deposited from a chemical vapor (CVD). Second diffusion barrier 140 is polished off surface 44 of single-crystal silicon 34', leaving second diffusion barrier 140 on electrical conductor 130 in trench 124, as shown in FIG. 19c, where it blocks diffusion of electrical conductor 130 into single-crystal silicon. With aluminum as electrical conductor 130, chlorine gas is used for the recess etch. Planar glass structural support member 30' is then bonded to front surface 44 of single-crystal silicon wafer 34', with its Damascene electrical conductor 130, as shown in FIG. 19d.

While several embodiments, together with modifications thereof, have been described in detail herein and illustrated in the accompanying drawings, it will be evident that various further modifications are possible without departing from the scope of the invention as defined in the appended claims. Nothing in the above specification is intended to limit the invention more narrowly than the appended claims. The examples given are intended only to be illustrative rather than exclusive.

What is claimed is:

1. A method of fabricating a single-crystal silicon photovoltaic cell comprising:
   a. providing a single-crystal silicon wafer and a structural support member, wherein said single-crystal silicon wafer has a first major surface and a second major surface, wherein each said major surface extends along a major surface plane, wherein said single-crystal silicon wafer has a thickness greater than 100 micrometers and a dimension greater than 50 mm, wherein said structural support member has a thermal expansion coefficient different from that of said single-crystal silicon wafer;
   b. mounting said structural support member to at least one from the group consisting of said first major surface and said second major surface;
   c. reducing thickness of said single-crystal silicon wafer to a thickness less than or equal to 100 micrometers while said single-crystal silicon wafer is mounted to said structural support member, wherein said reducing thickness includes stressing said single-crystal silicon wafer to cleave said single-crystal silicon wafer parallel to said first major surface, wherein said stressing includes providing a thermal gradient in a direction along said first major surface while cooling said structural support member mounted on said single-crystal silicon wafer, wherein said providing a thermal gradient in a direction along said first major surface includes providing a cooling element touching a portion of an edge of said single-crystal silicon wafer and corresponding portions of an edge of said structural support member; and
   d. providing said first major surface with a diffusion and a metalization grid and providing said second major surface with a back surface contact.

2. The method as recited in claim 1, wherein said mounting includes anodic bonding or epoxy bonding.

3. The method as recited in claim 1, wherein said stressing further includes mechanical.

4. The method as recited in claim 3, wherein said mechanical stressing is provided by providing said structural support member of a material with a Young's Modulus different from that of said single-crystal silicon wafer.

5. The method as recited in claim 3, wherein said mechanical stressing is provided with a pushing-apart device.

6. The method as recited in claim 5, wherein said pushing-apart device includes at least one from the group consisting of a ball, a roller and a wedge.

7. The method as recited in claim 1, wherein said reducing thickness includes at least one from the group consisting of etching, grinding, and polishing said single-crystal silicon wafer.

8. The method as recited in claim 1, further comprising providing said first major surface with said diffusion and said metalization grid in advance of said mounting step (b), further comprising forming grooves in said structural support member, wherein said mounting includes providing said metalization grid within said grooves, wherein said reducing said thickness and providing said back surface contact is performed after said mounting step (b).

9. The method as recited in claim 8, wherein said forming grooves in said structural support member includes forming grooves with an inverted V-angled cross section.

10. The method as recited in claim 9, wherein said forming grooves with an inverted V-angled cross section includes providing said V-angle configured so sunlight incident on said grooves is reflected between said metalization lines.

11. The method as recited in claim 10, wherein said forming grooves with an inverted V-angled cross section includes providing a vacuum or a material within said grooves that allows total internal reflection of sunlight incident on said inverted V-angled grooves.

12. The method as recited in claim 1, wherein said structural support member is sized to support a plurality of said single-crystal silicon wafers, wherein said reducing thickness step is performed on a plurality of single-crystal silicon wafers after mounting said plurality of single-crystal silicon wafers on said structural support member.

13. The method as recited in claim 12, wherein said reducing thickness includes at least one from the group consisting of etching, grinding, polishing, and stressing said plurality of single-crystal silicon wafers.

14. The method as recited in claim 13, wherein said stressing includes providing said structural support member that has a thermal expansion coefficient different from that of said single-crystal silicon wafers and further comprising providing a thermal gradient while cooling said structural support member mounted on said plurality of single-crystal silicon wafers.

15. The method as recited in claim 1, further comprising forming said grid metalization Damascene-recessed in said single-crystal silicon wafer.

16. The method as recited in claim 1, further comprising forming inverted pyramids on said first major surface and forming a reflector on said second major surface, wherein said forming a reflector includes forming back surface texturing or forming a back surface grating.

17. The method as recited in claim 16, further comprising forming a back surface passivation.

18. The method as recited in claim 1, wherein said cooling said structural support member mounted on said single-crystal silicon wafer provides a region of zero stress, further comprising providing a sufficient thermal gradient in a direction along said first major surface so said region is moved off said single-crystal silicon wafer.

19. A method of fabricating a single-crystal silicon device comprising:
   a. providing a plurality of single-crystal silicon wafers and a structural support member, wherein each said single-crystal silicon wafer has a first major surface and a second major surface, wherein each said major surface extends along a major surface plane, wherein each said single-crystal silicon wafer has a thickness greater than 100 micrometers and a dimension greater than 50 mm, wherein said structural support member has a thermal expansion coefficient different from that of each said single-crystal silicon wafer, wherein said structural support member is sized to support said plurality of said single-crystal silicon wafers;
   b. mounting said structural support member to at least one from the group consisting of said first major surface and said second major surface of each of said plurality of single-crystal wafers;
   c. reducing thickness of said single-crystal silicon wafer to a thickness less than or equal to 100 micrometers while said single-crystal silicon wafer is mounted to said structural support member, wherein said reducing thickness includes stressing said single-crystal silicon wafer to cleave said single-crystal silicon wafer parallel to said first major surface, wherein said stressing includes providing a thermal gradient in a direction along said first major surface while cooling said structural support member mounted on said single-crystal silicon wafer, wherein said reducing thickness step is performed on said plurality of single-crystal silicon wafers after said mounting said plurality of single-crystal silicon wafers on said structural support member; and
   d. providing said first major surface with a diffusion and a metalization grid and providing said second major surface with a back surface contact.

20. The method as recited in claim 19, wherein said reducing thickness includes at least one from the group consisting of etching, grinding, polishing, and stressing said plurality of single-crystal silicon wafers.

21. The method as recited in claim 20, wherein said stressing includes providing said structural support member that has a thermal expansion coefficient different from that of said single-crystal silicon wafers and further comprising providing a thermal gradient while cooling said structural support member mounted on said plurality of single-crystal silicon wafers.

* * * * *